(12) United States Patent
Schultz et al.

(10) Patent No.: US 11,145,609 B2
(45) Date of Patent: Oct. 12, 2021

(54) DOHERTY AMPLIFIER WITH SURFACE-MOUNT PACKAGED CARRIER AND PEAKING AMPLIFIERS

(71) Applicant: NXP USA, Inc., Austin, TX (US)

(72) Inventors: Joseph Gerard Schultz, Wheaton, IL (US); Jeffrey Kevin Jones, Chandler, AZ (US); Elie A. Maalouf, Mesa, AZ (US); Yu-Ting David Wu, Schaumburg, IL (US); Nick Yang, Wilmette, IL (US)

(73) Assignee: NXP USA, Inc., Austin, TX (US)

( * ) Notice: Subject to any disclaimer, the term of this patent is extended or adjusted under 35 U.S.C. 154(b) by 53 days.

(21) Appl. No.: 16/704,283

(22) Filed: Dec. 5, 2019

(65) Prior Publication Data

US 2021/0175186 A1 Jun. 10, 2021

(51) Int. Cl.

| H01L 23/66 | (2006.01) |
|---|---|
| H01L 23/495 | (2006.01) |
| H03F 1/02 | (2006.01) |
| H03F 3/21 | (2006.01) |
| H03F 3/24 | (2006.01) |
| H05K 1/02 | (2006.01) |

(52) U.S. Cl.
CPC .......... H01L 23/66 (2013.01); H01L 23/4952 (2013.01); H03F 1/0288 (2013.01);
(Continued)

(58) Field of Classification Search
CPC ................ H01L 23/66; H01L 23/4952; H01L 2223/665; H01L 2223/6655; H03F 1/0288;
(Continued)

(56) References Cited

U.S. PATENT DOCUMENTS 6,882,057 B2 4/2005 Hsu
8,228,123 B2 7/2012 Blednov
(Continued)

FOREIGN PATENT DOCUMENTS

EP 3480946 A1 5/2019

OTHER PUBLICATIONS

IEEE 100 The Authoritative Dictionary of IEEE Standards Terms, Seventh Edition, p. 610, Copyright by the Institute of Electrical and Electronics Engineers, Inc. All rights reserved. Published Dec. 2000. (Year: 2000).*
(Continued)

*Primary Examiner* — Hafizur Rahman
(74) *Attorney, Agent, or Firm* — Sherry W. Schumm

(57) ABSTRACT

An embodiment of a Doherty amplifier includes a module substrate, first and second surface-mount devices coupled to a top surface of the module substrate, and an impedance inverter line assembly. The first and second surface-mount devices include first and second amplifier dies, respectively. The impedance inverter line assembly is electrically connected between outputs of the first and second amplifier dies. The impedance inverter line assembly includes an impedance inverter line coupled to the module substrate, a first lead of the first surface-mount device coupled between the first amplifier die output and a proximal end of the impedance inverter line, and a second lead of the second surface-mount device coupled between the second amplifier die output and a distal end of the impedance inverter line. According to a further embodiment, the impedance inverter line assembly has a 90 degree electrical length at a fundamental operational frequency of the Doherty amplifier.

22 Claims, 7 Drawing Sheets

(52) U.S. Cl.
    CPC ............. *H03F 3/211* (2013.01); *H03F 3/245* (2013.01); *H05K 1/0243* (2013.01); *H01L 2223/665* (2013.01); *H01L 2223/6655* (2013.01); *H03F 2200/432* (2013.01)

(58) Field of Classification Search
    CPC .... H03F 3/211; H03F 3/245; H03F 2200/432; H05K 1/0243
    USPC ........................................................ 330/286
    See application file for complete search history.

(56) References Cited

U.S. PATENT DOCUMENTS

| | | |
|---|---|---|
| 8,587,101 B2 | 11/2013 | Fernando et al. |
| 8,736,034 B2 | 5/2014 | Montoriol, Jr. et al. |
| 9,774,301 B1 | 9/2017 | Maalouf et al. |
| 2018/0159479 A1 | 6/2018 | Wu et al. |

OTHER PUBLICATIONS

Baker, Bryant et al; "A Linear High Efficiency Doherty Amplifier with 40 dBm Saturated Output Power Using GaN on SiC HEMT Devices"; IEEE Topical Conf on Power Amplifiers for Wireless and Radio Applications; 3 pages (Jan. 25, 2015).

Crescenzi, E. J. et al; "60 Watt Doherty Amplifiers Using High Gain 2-Stage Hybrid Amplifier Modules"; IEEE MIT-S International Microwave Symposium, Piscataway, NJ, USA; 4 pages (2005).

Huang, Chaoyi et al; "Design of Broadband Modified Class-J Doherty Power Amplifier With Specific Second Harmonic Terminations"; IEEE Access, vol. 6; 10 pages (Dec. 2018).

\* cited by examiner

US 11,145,609 B2

DOHERTY AMPLIFIER WITH SURFACE-MOUNT PACKAGED CARRIER AND PEAKING AMPLIFIERS

TECHNICAL FIELD

Embodiments of the subject matter described herein relate generally to radio frequency (RF) amplifiers, and more particularly to multiple-path amplifiers (e.g., Doherty amplifiers) and amplifier modules.

BACKGROUND

The Doherty power amplifier is ubiquitous within cellular base station transmitters because the Doherty power amplifier architecture is known to improve back-off efficiency for spectrally efficient modulations, when compared with other types of amplifiers. The high efficiency of the Doherty power amplifier makes the architecture desirable for current and next-generation wireless systems. However, the trends toward higher and higher operational frequencies (e.g., in the gigahertz (GHz) range) and increased system miniaturization presents challenges to conventional Doherty power amplifier architectures, particularly in the area of semiconductor package design. As frequencies continue to increase, effective Doherty power amplifier implementations are needed that enable high efficiency operation in low cost and small footprint solutions.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
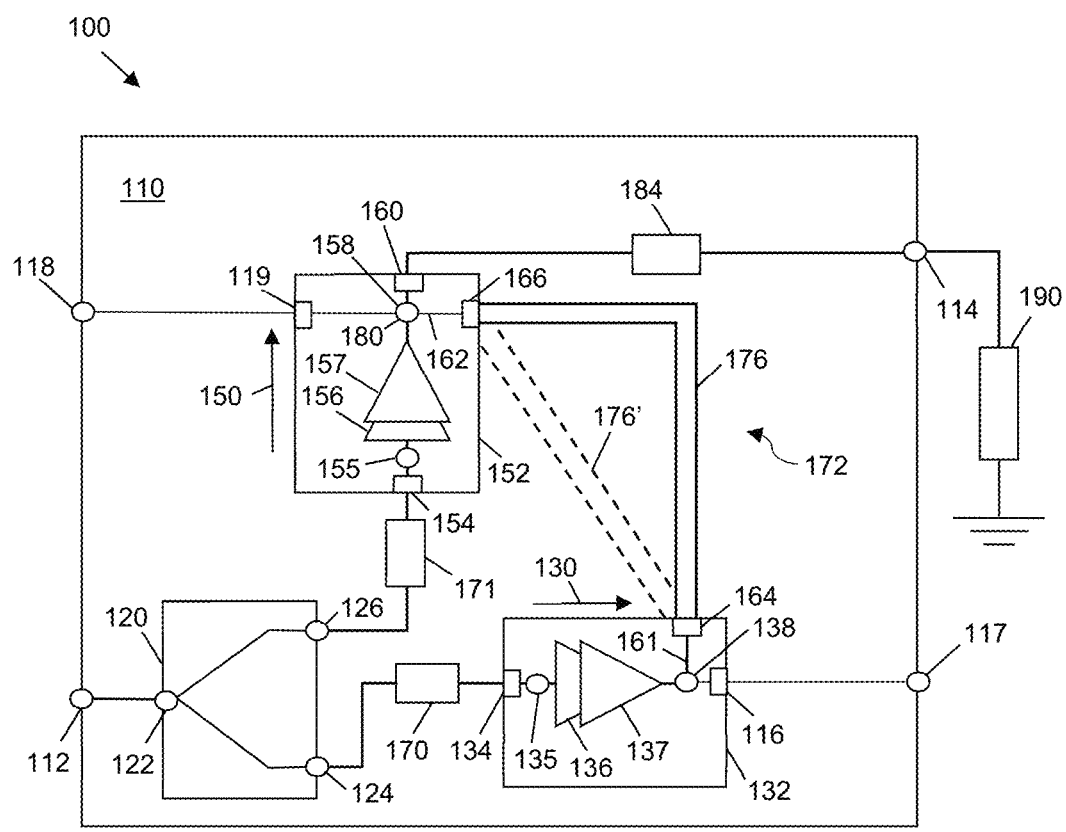
FIG. 1 is a schematic diagram of a Doherty amplifier, in accordance with an example embodiment.

An embodiment of a Doherty amplifier includes a module substrate having a top substrate surface, a first surface-mount device coupled to the top substrate surface, a second surface-mount device coupled to the top substrate surface, and an impedance inverter line assembly. The first surface-mount device includes a first amplifier die, the second surface-mount device includes a second amplifier die, and the impedance inverter line assembly is electrically connected between outputs of the first and second amplifier dies. The impedance inverter line assembly includes an impedance inverter line, a first lead of the first surface-mount device, and a second lead of the second surface-mount device. The impedance inverter line is coupled to the module substrate, and has a proximal end and a distal end. The first lead has a proximal end electrically coupled to an output of the first amplifier die, and a distal end coupled to the proximal end of the impedance inverter line. The second lead has a proximal end electrically coupled to an output of the second amplifier die, and a distal end coupled to the distal end of the impedance inverter line.

In a further embodiment, the first and second leads are selected from Quad Flat No-Lead (QFN) package leads, gull wing leads, Land Grid Array (LGA) package leads, and Ball Grid Array (BGA) package leads. In another further embodiment, a first electrical length between the proximal and distal ends of the first lead is in a range from 2 degrees to 16 degrees, a second electrical length between the proximal and distal ends of the impedance inverter line is in a range from 10 degrees to 80 degrees, a third electrical length between the proximal and distal ends of the second lead is in a range from 2 degrees to 16 degrees, and a total electrical length between the outputs of the first and second amplifier dies includes the first, second, and third electrical lengths, where the total electrical length is 90 degrees at a fundamental frequency of operation of the Doherty amplifier. In another further embodiment, the proximal ends of the first and second leads are electrically coupled to the outputs of the first and second amplifier dies with wirebonds. In another further embodiment, the first lead is a first vertical conductor that conducts a first electrical signal between the proximal and distal ends of the first lead in a direction that is angularly offset from a primary direction of signal conduction through the first amplifier die, and the second lead is a second vertical conductor that conducts a second electrical signal between the proximal and distal ends of the second lead in a direction that is angularly offset from a primary direction of signal conduction through the second amplifier die.

Another embodiment of a Doherty amplifier includes a module substrate having a top substrate surface, an impedance inverter line coupled to the module substrate, a first surface-mount device coupled to the top substrate surface, and a second surface-mount device coupled to the top substrate surface. The impedance inverter line has a proximal end and a distal end, and the impedance inverter line is characterized by a first electrical length between the proximal and distal ends of the impedance inverter line. The first surface-mount device includes a first package body, a first vertical lead, and a first amplifier die coupled to the first package body. The first vertical lead has a proximal end internal to the first package body, and a distal end external to the first package body. The proximal end of the first vertical lead is above a bottom surface of the first surface-mount device, and the first vertical lead is characterized by a second electrical length between the proximal and distal ends of the first vertical lead. The proximal end of the first vertical lead is electrically coupled to an output terminal of a first power transistor integrally formed with the first amplifier die, and the distal end of the first vertical lead is coupled to the proximal end of the impedance inverter line.

The second surface-mount device includes a second package body, a second vertical lead, and a second amplifier die coupled to the second package body. The second vertical lead has a proximal end internal to the second package body, and a distal end external to the second package body. The proximal end of the second vertical lead is above a bottom surface of the second surface-mount device, and the second vertical lead is characterized by a third electrical length between the proximal and distal ends of the second vertical lead. The proximal end of the second vertical lead is electrically coupled to an output terminal of a second power transistor integrally formed with the second amplifier die, and the distal end of the second vertical lead is coupled to the distal end of the impedance inverter line.

In a further embodiment, each of the first and second surface-mount devices is a Quad Flat No-Lead (QFN) packaged device, and the distal ends of the first and second vertical leads are co-planar with the bottom surfaces of the first and second surface-mount devices. In another further embodiment, the first and second vertical leads are gull wing leads. In another further embodiment, each of the first and second package bodies include a Land Grid Array (LGA) that includes an array of lands at the bottom surfaces of the first and second surface-mount devices. In another further embodiment, each of the first and second package bodies include a Ball Grid Array (BGA) that includes an array of balls at the bottom surfaces of the first and second surface-mount devices. In another further embodiment, the first electrical length is in a range from 10 degrees to 80 degrees, the second electrical length is in a range from 2 degrees to 16 degrees, the third electrical length is in a range from 2 degrees to 16 degrees, and a total electrical length between the output terminals of the first and second power transistors includes the first, second, and third electrical lengths, and the total electrical length is 90 degrees. In another further embodiment, the total electrical length is affected by parasitic output capacitances of the first and second power transistors. In another further embodiment, the proximal end of the first vertical lead is electrically coupled to the output terminal of the first power transistor with at least one first wirebond, the at least one first wirebond is characterized by a fourth electrical length, the proximal end of the second vertical lead is electrically coupled to the output terminal of the second power transistor with at least one second wirebond, and the at least one second wirebond is characterized by a fifth electrical length. In another further embodiment, the first electrical length is in a range from 10 degrees to 80 degrees, the second electrical length is in a range from 2 degrees to 16 degrees, the third electrical length is in a range from 2 degrees to 16 degrees, the fourth electrical length is in a range from 3 degrees to 24 degrees, the fifth electrical length is in a range from 3 degrees to 24 degrees, and a total electrical length between the output terminals of the first and second power transistors includes the first, second, third, fourth, and fifth electrical lengths, and the total electrical length is 90 degrees. In another further embodiment, each of the output terminals of the first and second amplifier dies have a side pad to which the at least one first wirebond or the at least one second wirebond are coupled, and the at least one first wirebond and the at least one second wirebond each extend in a direction that is orthogonal to a primary direction of signal conduction through the first or second amplifier die. In another further embodiment, the first vertical lead is a first vertical conductor that conducts a first electrical signal between the proximal and distal ends of the first vertical lead in a direction that is angularly offset from a primary direction of signal conduction through the first amplifier die, and the second vertical lead is a second vertical conductor that conducts a second electrical signal between the proximal and distal ends of the second vertical lead in a direction that is angularly offset from a primary direction of signal conduction through the second amplifier die. In another further embodiment, the first and second surface-mount devices are orthogonally arranged, and the impedance inverter line has an L shape. In another further embodiment, the first and second surface-mount devices are arranged in parallel, and the impedance inverter line is straight. In another further embodiment, the first amplifier is a carrier amplifier, and the second amplifier is a peaking amplifier. In another further embodiment, the first amplifier is a peaking amplifier, and the second amplifier is a carrier amplifier.

A conventional two-way Doherty power amplifier includes a signal splitter with an input and two outputs, where each splitter output is connected to an input to a carrier amplifier or a peaking amplifier. The carrier and peaking amplifier outputs are electrically connected to a combining node, which is configured to combine (in phase) the amplified output signals from the carrier and peaking amplifiers. More particularly, in a "0-90" Doherty power amplifier, the output of one of the amplifiers is directly connected to the combining node, where the direct connection is desirably characterized by about 0 degrees of phase shift. Conversely, the output of the other amplifier is coupled to the combining node through an impedance inverter, which is characterized by about 90 degrees of phase shift. Typically, the impedance inverter consists of a series of conductive structures, including an impedance inverter line (e.g., a transmission line on a printed circuit board (PCB)), which occupies a majority of the area utilized for the impedance inverter. Doherty power amplifiers implemented in integrated packages often have stringent size constraints that dictate the potential physical length of the impedance inverter line. Generally, it is desirable from a loss standpoint to make the impedance inverter line as compact as possible. However, there is an inherent tradeoff between impedance inverter line compactness and the ease of designing Doherty power amplifiers with optimized performance.

According to various Doherty power amplifier embodiments, each of the carrier and peaking amplifiers are implemented as one or more amplifier dies (i.e., integrated circuit (IC) or power transistor bearing semiconductor dies), packaged in a surface-mount type of package, where the "vertical" nature of the package leads enables a very compact impedance inverter line to be utilized. More specifically, vertical package leads are exploited, in the present embodiments, as portions of a minimum phase 90 degree inverter between the carrier and peaking amplifier outputs, and the vertical package leads facilitate optimal combining at the combining node (e.g., the peaking amplifier drain (current source)).

The impedance inverter essentially comprises a series-coupled assembly of conductive components connected between the outputs of the carrier and peaking amplifier dies. According to an embodiment, the series-coupled assembly includes electrical connections (e.g., wirebonds) between the carrier and peaking amplifier die outputs (e.g., drain terminals), vertical package leads, and an impedance inverter line. This "assembly" may be referred to herein as an impedance inverter and Doherty load modulation assembly, or more concisely as an "impedance inverter line assembly".

The carrier amplifier and the peaking amplifier each may be implemented using a single-stage or multiple-stage power amplifier comprised of one or more transistor integrated circuit (IC) dies. A single-stage power amplifier includes a single power transistor, and a multiple-stage power amplifier includes, at least, a driver transistor in series with a final-stage transistor. As used herein, when a power amplifier (e.g., the carrier or peaking amplifier) is a single-stage power amplifier, the single transistor stage may be considered a "final-stage" transistor. Using nomenclature typically applied to field effect transistors (FETs), on the input side, the carrier amplifier and the peaking amplifier each may include a transistor (e.g., a driver transistor and/or final-stage transistor) with an input/control terminal (e.g., a gate) configured to receive an RF input signal, and on the output side, the carrier amplifier and the peaking amplifier each may include a final-stage transistor with two current conducting terminals (e.g., a drain terminal and a source terminal). In some configurations, each source terminal is coupled to a ground reference voltage node, and the amplified carrier and peaking signals are provided at the drain terminals (or outputs) of the final-stage carrier amplifier transistor and the final-stage peaking amplifier transistor, respectively.

In a "non-inverting" Doherty power amplifier embodiment (also referred to as a "classical" Doherty, a "90-0" Doherty, or a "0-90" Doherty), phase shift(s) are applied to the input RF signal(s) so that the phase of the RF signal provided to the peaking amplifier lags the phase of the RF signal provided to the carrier amplifier by about 90 degrees. According to embodiments illustrated and described in detail herein, the drain terminal of the peaking amplifier serves as the combining node for the amplified RF signals produced by the carrier and peaking amplifiers. More specifically, the attached Figures and the below description illustrate and discuss an embodiment of a two-way, non-inverting Doherty power amplifier that includes a carrier amplifier and a single peaking amplifier, where the RF signal provided to the input of the peaking amplifier lags the RF signal provided to the input of the carrier amplifier by about 90 degrees. In other words, with respect to the input RF signal to the carrier amplifier, the input RF signal to the peaking amplifier has a phase lag of about 90 degrees. In such embodiments, the inverter line assembly functions to apply about a 90 degree phase shift (and an impedance inversion) to the amplified carrier signal before it is combined with the amplified peaking signal at the combining node, whereas no substantial phase shift is applied to the amplified peaking signal before it reaches the combining node.

To provide a 90 degree phase shift and an impedance inversion between the drain terminal of the carrier amplifier and the combining node (e.g., at the drain terminal of the peaking amplifier final-stage transistor), the drain terminal of the final-stage carrier amplifier transistor is electrically coupled to the first end of an embodiment of an impedance inverter line assembly, and the second end of the impedance inverter line assembly is electrically coupled to the drain terminal of the final-stage peaking amplifier transistor (i.e., the combining node). The electrical length of the impedance inverter line assembly between the drain terminals of the carrier and peaking amplifier final-stage transistors is determined by the parasitic drain-source capacitances of the carrier and peaking amplifier transistors, the electrical length of an impedance inverter line (e.g., a transmission line) extending between the carrier and peaking amplifier transistor drain terminals, and the electrical lengths of any additional series conductive structures between the drain terminals and the ends of the impedance inverter line.

In a 90-0 Doherty amplifier, because the drain-source capacitances and the electrical lengths of the additional series conductive structures are non-trivial, the electrical length of the impedance inverter line in an impedance inverter line assembly will have a value that is less than 90 degrees. In various embodiments, depending on the fundamental frequency of operation, $f_0$, of the Doherty amplifier and the characteristics of the connections to the ends of the impedance inverter line, the electrical length of the impedance inverter line may have a value in the range of about 10 degrees to about 70 degrees, although the electrical length of the impedance inverter line may be smaller or larger, as well. At higher fundamental operational frequencies, the electrical length translates into a very short physical length for the impedance inverter line, which may be difficult to realize in compact packaging arrangements. This difficulty becomes even more acute when the dielectric constant of the substrate (e.g., a PCB) to which the impedance inverter line is coupled is relatively high.

The various embodiments of the inventive subject matter overcome some or all of these challenges by utilizing unique, surface-mount packaging arrangements for the carrier and peaking amplifiers, which enable impedance inverter assemblies between the amplifiers to be more physically realizable, even for Doherty amplifiers that are configured to operate at relatively high fundamental operating frequencies, and/or for Doherty amplifiers that are constrained to fit into relatively compact footprints.

It should be noted that, whereas the attached Figures and the below description focus on non-inverting Doherty amplifier embodiments, other embodiments may include "inverting" Doherty amplifiers, in which the RF signal provided to the carrier amplifier lags the RF signal provided to the peaking amplifier by about 90 degrees, and phase shift(s) sufficient to phase-align the amplified carrier and peaking signals are applied between the carrier and peaking amplifier outputs and the combining node. Accordingly, in the claims, references to a "first amplifier" and a "first amplifier transistor" may correspond to a carrier amplifier (and carrier amplifier transistor) or a peaking amplifier (and peaking amplifier transistor), whereas references to a "second amplifier" and a "second amplifier transistor" may correspond to the other type of amplifier or transistor from the first type of amplifier or transistor. Further, although the Figures and the below description focus on two-way Doherty amplifiers, embodiments of inverter line assemblies also may be included in other n-way Doherty amplifiers that include a carrier amplifier and n−1 peaking amplifiers (where n has an integer value of two or more, such as a value from 3 to 5).

FIG. 1 is a schematic diagram of a Doherty amplifier 100, in accordance with an example embodiment. As indicated in FIG. 1 with box 110, some or all components of Doherty amplifier 100 may be implemented in a single amplifier module (e.g., some or all components are coupled to a single amplifier module substrate). As will be explained in detail later, and in accordance with various embodiments, the configurations of the various amplifier components enable the size of the module to be significantly reduced, when compared with conventional packaging techniques using conventional components. These miniaturization benefits may be realized while still meeting gain, linearity, stability, and efficiency performance criteria.

Doherty amplifier 100 includes an RF input node 112, an RF output node 114, a power splitter 120, a carrier amplifier path 130, a peaking amplifier path 150, an impedance inverter line assembly 172, and a combining node 180, in an embodiment. As will be discussed in more detail below, embodiments of the impedance inverter line assembly 172 include a transmission line 176, leads 164, 166, and additional series components 161, 162 (e.g., wirebonds) that establish the electrical length of the impedance inverter line assembly 172. As will be discussed in more detail in conjunction with FIG. 2, parasitic output capacitances of the carrier and peaking amplifiers also affect the electrical length of the impedance inverter line assembly 172.

When incorporated into a larger RF system, the RF input node 112 is coupled to an RF signal source (not illustrated), and the RF output node 114 is coupled to a load 190 (e.g., an antenna or other load). The RF signal source provides an RF input signal, which is an analog signal that includes spectral energy that typically is centered around one or more carrier frequencies. Fundamentally, the Doherty amplifier 100 is configured to amplify the RF input signal, and to produce an amplified RF signal at the RF output node 114.

The power splitter 120 has an input 122 and two outputs 124, 126, in an embodiment. The power splitter input 122 is coupled to the RF input node 112 to receive the RF input signal. The power splitter 120 is configured to divide the RF input signal received at input 122 into first and second RF signals (or carrier and peaking signals), which are provided to the carrier and peaking amplifier paths 130, 150 through outputs 124, 126, respectively. According to an embodiment, the power splitter 120 includes a first phase shift element, which is configured to impart one or more phase shifts to the first and second RF signals to establish a phase difference between the signals at the outputs 124, 126 (e.g., about a 90 degree phase difference). In a non-inverting Doherty amplifier, the phase shift(s) are applied so that the phase of the RF signal provided to the peaking amplifier lags the phase of the RF signal provided to the carrier amplifier by about 90 degrees. Accordingly, at outputs 124 and 126, the carrier and peaking signals may be about 90 degrees out of phase from each other.

When Doherty amplifier 100 has a symmetrical configuration (i.e., a configuration in which the carrier and peaking amplifier power transistors are substantially identical in size), the power splitter 120 may divide or split the RF input signal received at the input 122 into two signals that have substantially equal power. Conversely, when Doherty amplifier 100 has an asymmetrical configuration (i.e., a configuration in which one of the amplifier power transistors, typically the peaking amplifier transistor, is significantly larger), the power splitter 120 may output signals having unequal power. For example, in one embodiment, the peaking amplifier transistor may be about twice the size of the carrier amplifier transistor, and the power splitter 120 may provide a peaking signal with about twice the power as a carrier signal. In some embodiments, the power splitter 120 may be implemented with fixed-value, passive components. In other embodiments, the power splitter 120 may be implemented with one or more controllable variable attenuators and/or variable phase shifters, which enable the power splitter 120 to attenuate and/or phase shift the carrier and peaking signals based on externally-provided control signals.

The outputs 124, 126 of the power splitter 120 are connected to the carrier and peaking amplifier paths 130, 150, respectively. The carrier amplifier path 130 is configured to amplify the carrier signal from the power splitter 120, and to provide the amplified carrier signal to the power combining node 180. Similarly, the peaking amplifier path 150 is configured to amplify the peaking signal from the power splitter 120, and to provide the amplified peaking signal to the power combining node 180, where the paths 130, 150 are designed so that the amplified carrier and peaking signals arrive substantially in phase with each other at the power combining node 180.

According to an embodiment, the carrier amplifier path 130 includes an input circuit 170 (e.g., including an impedance matching circuit), a carrier amplifier device 132, and impedance inverter line assembly 172. The peaking amplifier path 150 includes an input circuit 171 (e.g., including an impedance matching circuit), and a peaking amplifier device 152. The carrier and peaking amplifier devices 132, 152 correspond to the carrier and peaking amplifiers, respectively, of the Doherty amplifier 100, and the carrier and peaking amplifiers are implemented using packaged carrier and peaking amplifier devices 132, 152, respectively. According to an embodiment, and as will be described in more detail later, each of the carrier and peaking amplifier devices 132, 152 are packaged as surface-mount devices, such as rectangular, no-leads packaged devices (e.g., Quad Flat No-Lead (QFN) packaged devices) or other types of surface-mount devices. As such, each device 132, 152 includes a plurality of leads (e.g., leads 423-426, FIG. 4), a thermal pad or flange (e.g., flange 411, FIG. 4), a package body (e.g., lower package body 412, FIG. 4) that holds the leads and the flange in a fixed orientation with respect to each other, one or more power transistor dies (e.g., die 432, FIG. 4) attached to the flange, and electrical conductors (e.g., wirebonds 455, 465, 462, 463, FIG. 4) electrically coupling the die(s) to the leads.

The carrier amplifier device 132 includes an RF input lead 134, an RF input terminal 135 electrically connected to the RF input lead 134, an RF output terminal 138, an RF output lead 164 electrically connected to the RF output terminal 138, and one or more amplification stages 136, 137 coupled between the input and output terminals 135, 138, in various embodiments. The RF input lead 134 is coupled through input circuit 170 to the first output 124 of the power splitter 120, and thus the RF input lead 134 receives the carrier signal produced by the power splitter 120. One or more bias voltage terminals (e.g., drain bias voltage lead 116) may be coupled to one or more external bias circuits (e.g., through terminal 117) for providing DC bias voltages to the amplification stages 136, 137.

Each amplification stage 136, 137 of the carrier amplifier device 132 includes a power transistor. More specifically, each power transistor includes a control terminal (e.g., a gate terminal) and first and second current-carrying terminals (e.g., a drain terminal and a source terminal). In a single-stage device, which would include a single power transistor (e.g., stage 137 but not stage 136), the control terminal of the single power transistor corresponds to the RF input terminal 135, which is electrically connected to the RF input lead 134. One of the current-carrying terminals (e.g., the drain terminal or the source terminal) corresponds to the RF output terminal 138, which is electrically connected to the RF output lead 164. The other current-carrying terminal (e.g., the source terminal or the drain terminal) is electrically connected to a ground reference (e.g., the package flange to which the transistor die is coupled). Conversely, a two-stage device would include two power transistors (e.g., both stages 136, 137) coupled in series, where a first transistor functions as a driver amplifier transistor that has a relatively low gain, and a second transistor functions as an output stage (or final stage) amplifier transistor that has a relatively high gain. In such an embodiment, the control terminal of the driver amplifier transistor corresponds to the RF input terminal 135, which is electrically connected to the RF input lead 134. One of the current-carrying terminals of the driver amplifier transistor (e.g., the drain terminal or the source terminal) is electrically connected to the control terminal of the final-stage amplifier transistor, and the other current-carrying terminal of the driver amplifier transistor (e.g., the source terminal or the drain terminal) is electrically connected to the ground reference. Additionally, one of the current-carrying terminals of the final-stage amplifier transistor (e.g., the drain terminal or the source terminal) corresponds to the RF output terminal 138, which is electrically connected to the RF output lead 164. The other current-carrying terminal of the final-stage amplifier transistor (e.g., the source terminal or the drain terminal) is electrically connected to the ground reference.

In addition to the power transistor(s), portions of input and output impedance matching networks and bias circuitry (not illustrated in FIG. 1) also may be included as portions of the carrier amplifier device 132 and/or electrically coupled to the carrier amplifier device 132. Further, in an embodiment in which the carrier amplifier device 132 is a two-stage device, an interstage matching network (not illustrated in FIG. 1) also may be included as a portion of the carrier amplifier device 132.

Reference is now made to the peaking amplifier path 150, which includes an input circuit 171 (e.g., including an impedance matching circuit) and a peaking amplifier device 152, in an embodiment. The peaking amplifier device 152 includes an RF input lead 154, a first RF input terminal 155 electrically connected to the RF input lead 154, an RF output terminal 158, an RF output lead 160 electrically connected to the RF output terminal 158, a second RF input lead 166 electrically connected to the RF output terminal 158, and one or more amplification stages 156, 157 coupled between the input and output terminals 155, 158, in various embodiments. The RF input lead 154 is coupled through input circuit 171 to the second output 126 of the power splitter 120, and thus the RF input lead 154 receives the peaking signal produced by the power splitter 120. One or more bias voltage terminals (e.g., drain bias voltage lead 119) may be coupled to one or more external bias circuits (e.g., through terminal 118) for providing DC bias voltages to the amplification stages 156, 157.

As with the carrier amplifier device 132, each amplification stage 156, 157 of the peaking amplifier device 152 includes a power transistor. More specifically, each power transistor includes a control terminal (e.g., a gate terminal) and first and second current-carrying terminals (e.g., a drain terminal and a source terminal). In a single-stage device, which would include a single power transistor (e.g., stage 157 but not stage 156), the control terminal of the single power transistor corresponds to the RF input terminal 155, which is electrically connected to the RF input lead 154. One of the current-carrying terminals (e.g., the drain terminal or the source terminal) corresponds to the RF output terminal 158, which is electrically connected to the second RF input lead 166 and to the RF output lead 160. The other current-carrying terminal (e.g., the source terminal or the drain terminal) is electrically connected to a ground reference (e.g., the package flange to which the transistor die is coupled). Conversely, a two-stage device would include two power transistors (e.g., both stages 156, 157) coupled in series, where a first transistor functions as a driver amplifier transistor that has a relatively low gain, and a second transistor functions as an output stage (or final stage) amplifier transistor that has a relatively high gain. In such an embodiment, the control terminal of the driver amplifier transistor corresponds to the RF input terminal 155, which is electrically connected to the RF input lead 154. One of the current-carrying terminals of the driver amplifier transistor (e.g., the drain terminal or the source terminal) is electrically connected to the control terminal of the final-stage amplifier transistor, and the other current-carrying terminal of the driver amplifier transistor (e.g., the source terminal or the drain terminal) is electrically connected to the ground reference. Additionally, one of the current-carrying terminals of the final-stage amplifier transistor (e.g., the drain terminal or the source terminal) corresponds to the RF output terminal 158, which is electrically connected to the RF input lead 166 and to the RF output lead 160. The other current-carrying terminal of the final-stage amplifier transistor (e.g., the source terminal or the drain terminal) is electrically connected to the ground reference.

In addition to the power transistor(s), portions of input and output impedance matching networks and bias circuitry (not illustrated in FIG. 1) also may be included as portions of the peaking amplifier device 152 and/or electrically coupled to the peaking amplifier device 152. Further, in an embodiment in which the peaking amplifier device 152 is a two-stage device, an interstage matching network (not illustrated in FIG. 1) also may be included as a portion of the peaking amplifier device 152.

The RF output terminal 158 of the peaking amplifier device 152 is coupled to the power combining node 180 and to the impedance inverter line assembly 172. According to an embodiment, the RF output terminal 158 of the peaking amplifier device 152 and the combining node 180 are implemented with a common element. More specifically, in an embodiment, the RF output terminal 158 of the peaking amplifier device 152 is configured to function both as the combining node 180 and as the output terminal 158 of the peaking amplifier device 152.

The RF output terminals 138, 158 of the carrier and peaking amplifier devices 132, 152 are coupled together through the impedance inverter line assembly 172. Or, said another way, the RF output terminal of the carrier amplifier device 132 is electrically coupled to the combining node 180 through the impedance inverter line assembly 172, and the RF output terminal of the peaking amplifier device 152 is directly coupled to the combining node 180. As will be discussed in detail below, an embodiment of an impedance inverter line assembly 172 includes the RF output lead 164 of the carrier amplifier device 132, a transmission line 176 (e.g., a microstrip or stripline transmission line), an RF input lead 166 of the peaking amplifier device 152, and additional electrical connections 161, 163 (e.g., wirebonds) between the carrier and peaking amplifier outputs 138, 158 and the leads 164, 166.

According to an embodiment, the impedance inverter line assembly 172 is a lambda/4 ($\lambda/4$) phase shift circuit, which imparts about a 90 degree relative phase shift at the fundamental frequency of operation, $f_0$, to the carrier signal after amplification by the carrier amplifier device 132. A first or "proximal" end of the impedance inverter line assembly 172 is coupled to the RF output terminal 138 of the carrier amplifier device 132, and a second or "distal" end of the impedance inverter line assembly 172 is coupled to the power combining node 180.

The amplifier 100 is designed so that, during operation, the amplified carrier and peaking RF signals combine substantially in phase (or coherently) at the combining node 180. The combining node 180 is electrically coupled through RF output lead 160 and output impedance matching network 184 to the RF output node 114. Accordingly, the amplified and combined RF output signal is provided through lead 160 and network 184 to the RF output node 114. In an embodiment, the output impedance matching network 184 between the combining node 180 and the RF output node 114 functions to present proper load impedances to each of the carrier and peaking amplifier device 132, 152. The resulting amplified RF output signal is produced at RF output node 114, to which an output load 190 (e.g., an antenna) is connected.

Amplifier 100 is configured so that the carrier amplifier path 130 provides amplification for relatively low level input signals, and both amplifier paths 130, 150 operate in combination to provide amplification for relatively high level input signals. This may be accomplished, for example, by biasing the carrier amplifier device 132 so that the carrier amplifier device 132 operates in a class AB mode, and biasing the peaking amplifier device 152 so that the peaking amplifier device 152 operates in a class C mode.

According to an embodiment, the carrier and peaking amplifier devices 132, 152 are oriented, with respect to each other, so that corresponding portions of the carrier and peaking amplifier paths 130, 150 extend in directions that are substantially different from each other. As used herein, the term "signal path" refers to the path followed by an RF signal through a circuit. For example, a portion of a first signal path through the carrier amplifier device 132 extends in a first direction (indicated by arrow 130) between the RF input and output terminals 135, 138. Similarly, a portion of a second signal path through the peaking amplifier device 152 extends in a second direction (indicated by arrow 150) between the RF input and output terminals 155, 158, where the first and second directions are substantially different from each other. In the illustrated embodiment, the first and second directions are perpendicular to each other (i.e., angularly separated by 90 degrees). In other embodiments, the first and second directions may be angularly separated by less or more than 90 degrees. For example, the first and second directions may be angularly separated by any angle between 45 degrees and 315 degrees, in other embodiments. In still other embodiments, the first and second directions may be parallel (e.g., the carrier and peaking amplifier devices 132, 152 may be oriented in the same direction.

As discussed above, an embodiment of an impedance inverter line assembly 172 includes a transmission line 176, leads 164, 166, and (optionally) additional series components 161, 162 (e.g., wirebonds). The electrical characteristics of the impedance inverter line assembly 172 now will be discussed in more detail in conjunction with FIG. 2. More specifically, FIG. 2 is a schematic diagram representing the interconnection between the output terminal 238 of an output stage 237 of a carrier device (e.g., output stage 137, FIG. 1) and the output terminal 258 of an output stage 257 of a peaking device (e.g., output stage 157, FIG. 1) through an embodiment of an impedance inverter line assembly 272 (e.g., assembly 172, FIG. 1).

Figure 2:
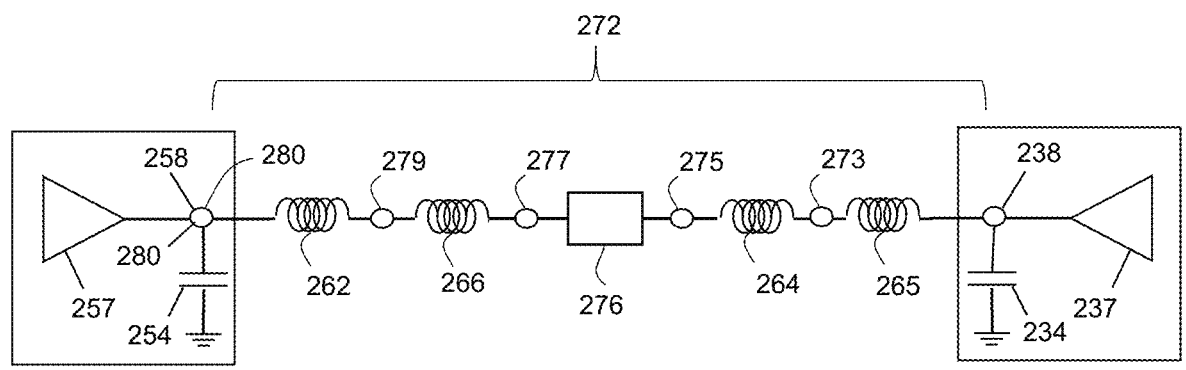
FIG. 2 is a schematic diagram representing a carrier device, a peaking device, and a series of inductive components forming an inverter line assembly between the carrier device output and a combining node, in accordance with an example embodiment.

In FIG. 2, node 238 represents the drain of the output stage 237 of a carrier device (e.g., node 138 of carrier device 132, FIG. 1), and node 258 represents the drain of the output stage 257 of a peaking device (e.g., node 258 of peaking device 152, FIG. 1). As discussed above, node 258 also corresponds to the combining node 280 (e.g., combining node 180, FIG. 1). Capacitor 234 represents the parasitic drain-source shunt capacitance of the carrier output stage 237, and capacitor 254 represents the parasitic drain-source shunt capacitance of the peaking output stage 257. Bracket 272 encompasses elements that comprise the impedance inverter line assembly (e.g., assembly 172, FIG. 1) interconnecting the drains (nodes 238, 258) of the carrier and peaking output stages 237, 257.

Figure 7:
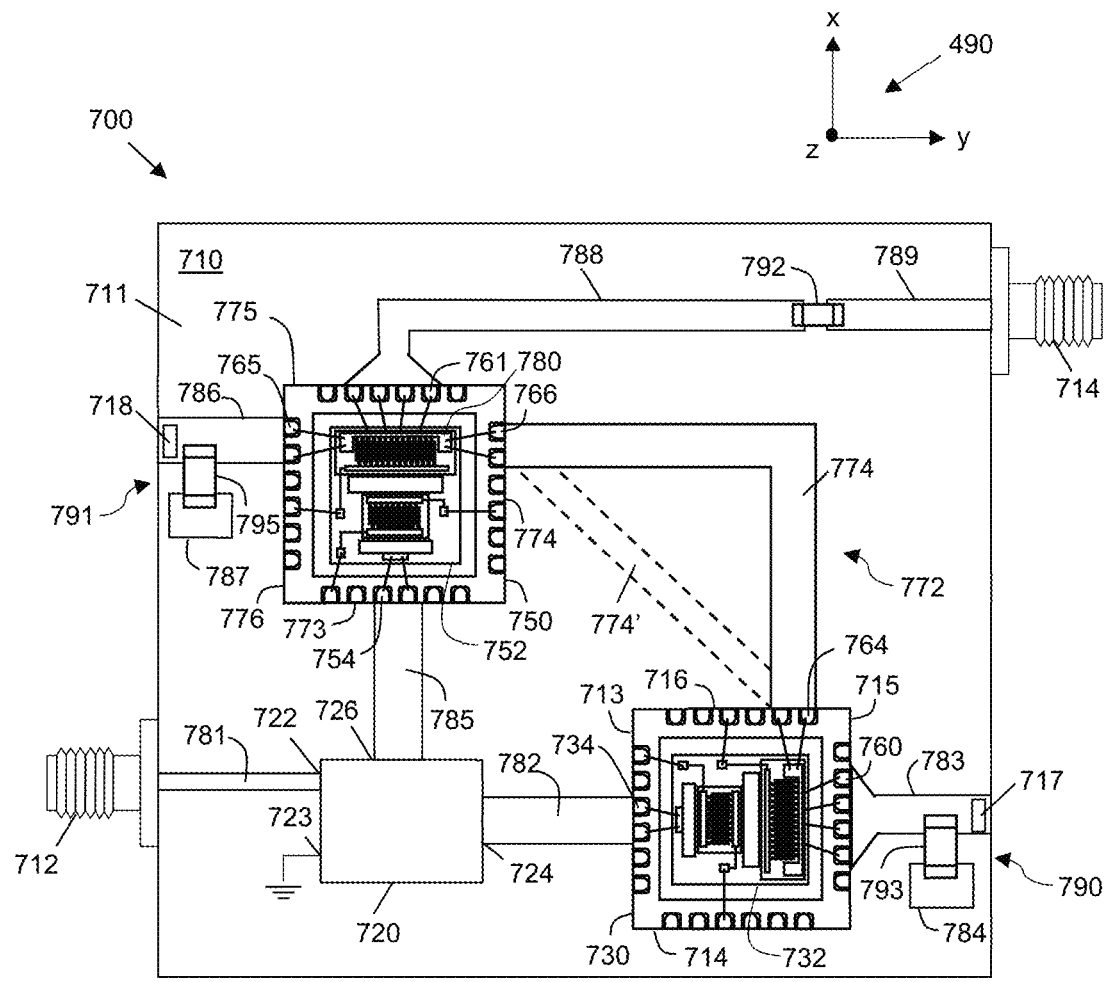
FIG. 7 is a top view of a Doherty amplifier module with no-leads carrier and peaking amplifier devices in an orthogonal arrangement, in accordance with an example embodiment.
Figure 8:
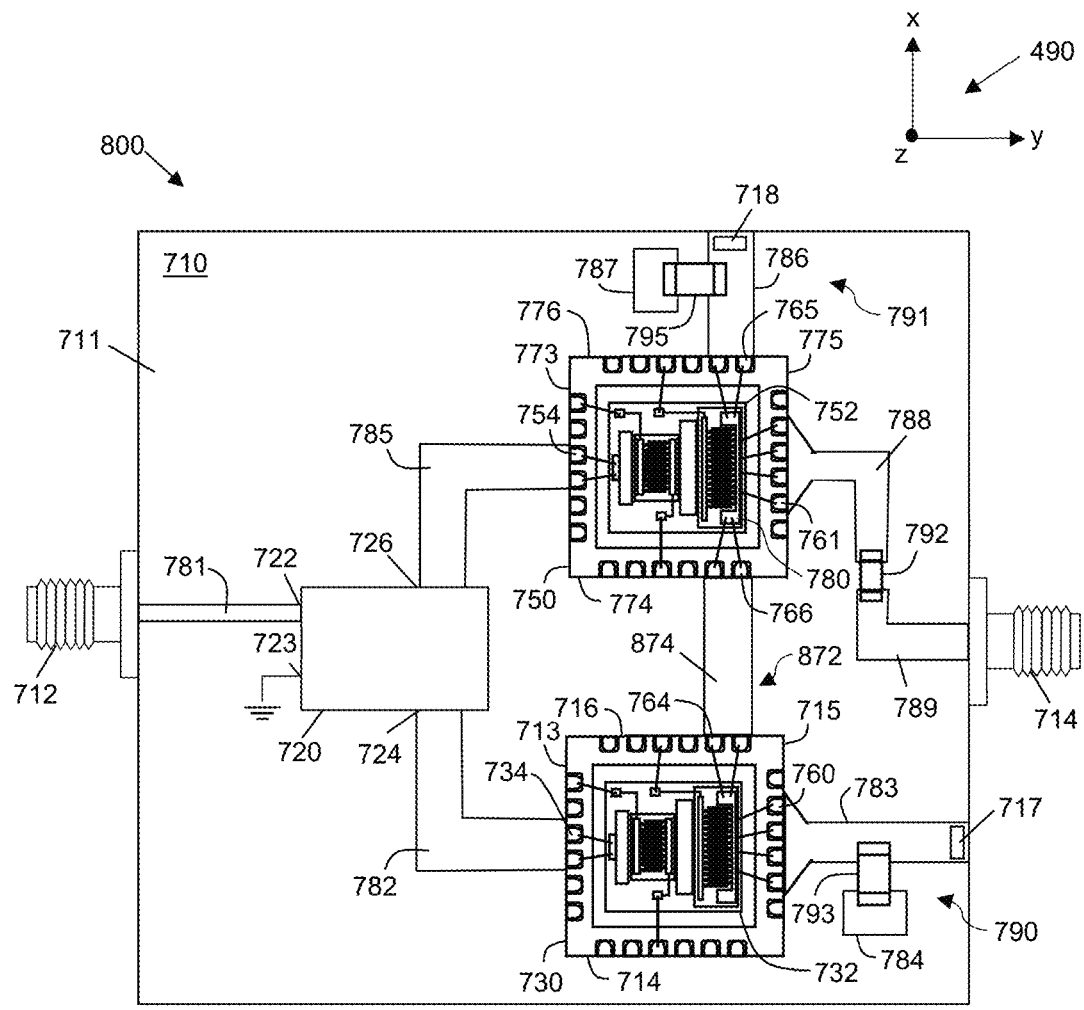
FIG. 8 is a top view of a Doherty amplifier module with no-leads carrier and peaking amplifier devices in a parallel arrangement, in accordance with an example embodiment.

The impedance inverter line assembly 272 includes a plurality of components coupled in series. According to an embodiment, the series-coupled components of the impedance inverter line assembly 272 include:

- a first inductance 265 (e.g., connection 161, FIG. 1 or wirebond array 465, FIG. 4) coupled to the output terminal 238 (e.g., the drain terminal) of the carrier output stage 237, which has an inductance value in a range of about 0.5 nanohenries (nH) to about 1.0 nH, although the inductance value could be lower or higher;
- a second inductance 264 (e.g., corresponding to the inductance of an RF output lead 164, FIG. 1 or leads 764, FIGS. 7, 8) coupled at node 273 to the first inductance 265, which has an inductance value in a range of about 0.25 nH to about 0.75 nH, although the inductance value could be lower or higher;
- a transmission line 276 (e.g., transmission line 176, FIG. 1 or transmission line 774, 774', or 874, FIGS. 7, 8) coupled at node 275 to the second inductance 265, which has an electrical length in a range of about 10 degrees to about 80 degrees, depending on fundamental operational frequency and other factors (discussed below);
- a third inductance 266 (e.g., corresponding to the inductance of an RF input lead 166, FIG. 1 or leads 766, FIGS. 7, 8) coupled at node 277 to the transmission line 276, which has an inductance value in a range of about 0.25 nH to about 0.75 nH, although the inductance value could be lower or higher;
- a fourth inductance 262 (e.g., connection 162, FIG. 1 or wirebond array 462, FIG. 4) coupled between node 279 and the output terminal 258 (e.g., the drain terminal) of the peaking output stage 257, and thus to the combining node 280, which has an inductance value in a range of about 0.5 nH to about 1.0 nH, although the inductance value could be lower or higher.

Figure 3:
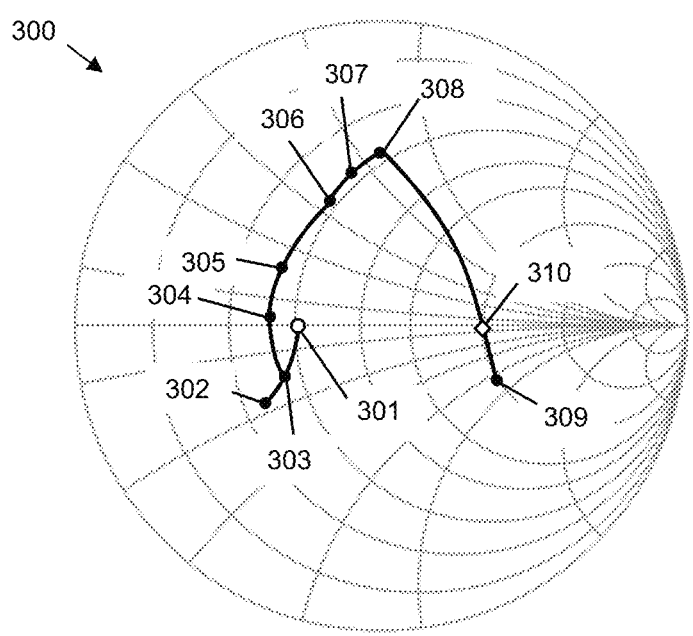
FIG. 3 is a Smith chart illustrating impedance transformations that may be performed using an example embodiments of an inverter line assembly.

The Smith chart 300 of FIG. 3 is provided to illustrate impedance movements due to the parasitic shunt capacitances 234, 254 and the various series elements in the impedance inverter line assembly 272. More specifically, the Smith chart 300 is used to illustrate how the total Zmod transformation occurs between the drain 258 of the peaking device 257 (or the combining node 280 (e.g., combining node 180, FIG. 1)) and the drain 238 of the carrier device 237 through the impedance inverter line assembly 272. The example Smith chart 300 assumes that the impedance at the drain 238 of the carrier device 237 is at about 25 ohms, and that the impedance at the combining node 280 (i.e., the drain 258 of the peaking device 257) is at about 100 ohms. Those of skill in the art would understand, based on the description herein, how the Smith chart could be modified for a system with different characteristic impedances. Essentially, the impedance at the combining node (e.g., the drain 258 of the peaking device 257) is significantly lower (e.g., from 50-100 ohms lower) than the impedance at the drain 238 of the carrier device 237. For example, in some embodiments, the impedance at the drain 258 of the peaking device 257 may be in a range of about 10 ohms to about 30 ohms, and the impedance at the drain 238 of the carrier device 237 may be in a range of about 75 ohms to about 125 ohms, although the impedances may be lower or higher than these ranges, as well.

Point 301 of Smith chart 300 corresponds to the impedance (e.g., 25 ohms) at the drain 258 of the peaking device 257, which corresponds to the combining node (e.g., combining node 180, FIG. 1). Starting at point 301 and moving from the drain 258 of the peaking device 257 toward the drain 238 of the carrier device 237, the parasitic drain-source shunt capacitance 254 of the peaking device 257 causes a downward movement generally along a constant conductance circle to point 302. A shunt inductance circuit (e.g., the inductive portion of shunt circuit 791, FIG. 7) may be coupled to the drain of the peaking device 257 to cause a small upward movement to point 303. The first inductance 262 next causes an upward movement generally along a constant impedance circle to point 304 (e.g., corresponding to node 279). The second inductance 266 (e.g., RF output lead 166, FIG. 1) causes another upward movement generally along a constant impedance circle to point 305 (e.g., corresponding to node 277). As used herein, "generally along" a constant conductance or impedance circle is meant to indicate that the impedance change occurs substantially along a circle, but that there may be some slight diversion from the circle on the Smith chart.

The transmission line 276 causes yet another upward movement generally along a constant impedance circle to point 306 (e.g., corresponding to node 275). From there, the third inductance 264 (e.g., RF input lead 164, FIG. 1) causes another upward movement generally along a constant impedance circle to point 307 (e.g., corresponding to node 273). Next, the fourth inductance 265 causes another upward movement generally along a constant impedance circle to point 308 (e.g., corresponding to node 238). Finally, the parasitic drain-source shunt capacitance 234 of the carrier device 237 causes a downward movement generally along a constant conductance circle to point 309. Again, a shunt inductance circuit (e.g., the inductive portion of shunt circuit 790, FIG. 7) may be coupled to the drain of the carrier device 237 to cause a small upward movement to point 310, which corresponds to the impedance (e.g., 100 ohms) at the drain 238 of the carrier device 237.

Overall, to ensure that the amplified RF signal produced by the carrier amplifier 237 and the amplified RF signal produced by the peaking amplifier 257 combine in phase at the combining node (e.g., co-located with the drain 258 of the peaking device 257), the total electrical length between the drain nodes 238, 258 should be about 90 degrees. Further, the impedance transformation provided by the impedance inverter line assembly 272 should be designed to properly match the output impedances of the carrier and peaking devices 237, 257. Since the inductances/impedance transformations of elements 264, 266, 265, and 262 are likely to be relatively non-adjustable, FIG. 3 makes clear that the electrical length/impedance of the transmission line 276 may be selected to achieve the desired impedance transformation between the carrier and peaking devices 237, 257.

In a symmetric Doherty amplifier in which the carrier and peaking amplifiers 237, 257 are the same size, the drain-source capacitances 234, 254 may have approximately the same capacitance values, whereas in an asymmetric Doherty amplifier in which the peaking amplifier 257 is significantly larger than the carrier amplifier 237, the drain-source capacitance 254 of the peaking amplifier 257 may be significantly larger than the drain-source capacitance 234 of the carrier amplifier 237. Either way, the drain-source capacitances may significantly reduce the permissible electrical and physical lengths of the impedance inverter.

It should be noted that, in a practical circuit implementation, the electrical length of the transmission line 276 (e.g., transmission line 176, FIG. 1) is a substantially fixed value that may be significantly less than ninety degrees, such as a value in a range of about 10 degrees to about 70 degrees. At higher frequencies, this fixed electrical length may translate into a very short physical length. This is particularly true when the dielectric constant of the amplifier module substrate is high, which may be the case for a typical printed circuit board (PCB) type of substrate (e.g., amplifier module substrate 710, FIGS. 7, 8). Referring again to FIG. 1, the relatively-long physical and electrical length of transmission line 176 may, thus, be appropriate for relatively low operational frequencies. Further, transmission line 176 is shown to have an "L" shape with orthogonally-arranged carrier and peaking devices 132, 152, which may enable a compact amplifier configuration with orthogonally-arranged carrier and peaking devices 132, 152 (e.g., as shown in FIG. 7). In alternate embodiments, as indicated with transmission line 176', a relatively-short, straight transmission line alternatively may be implemented. In such embodiments, the carrier and peaking devices 132, 152 may be arranged in side-by-side (e.g., arranged in parallel as is shown in FIG. 8), rather than being arranged orthogonally.

Figure 4:
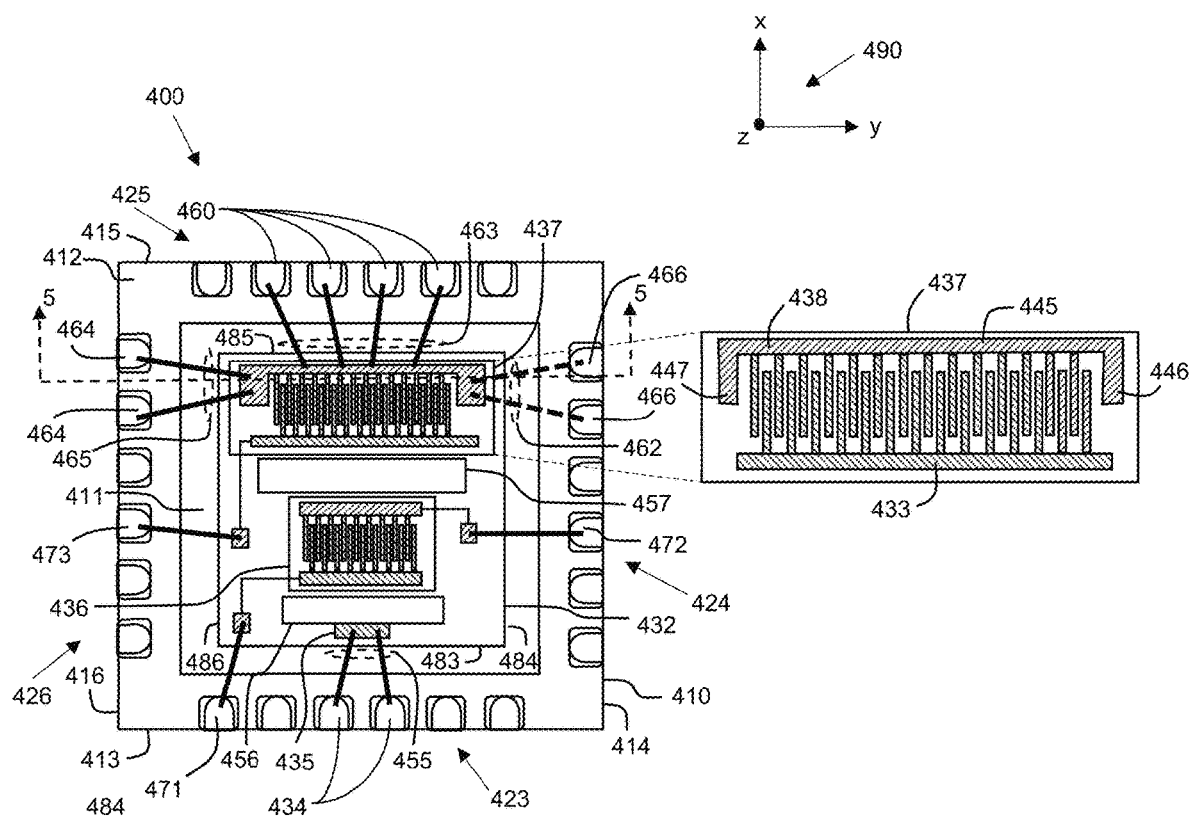
FIG. 4 is a top view of a no-leads packaged amplifier device, in accordance with an example embodiment.
Figure 5:
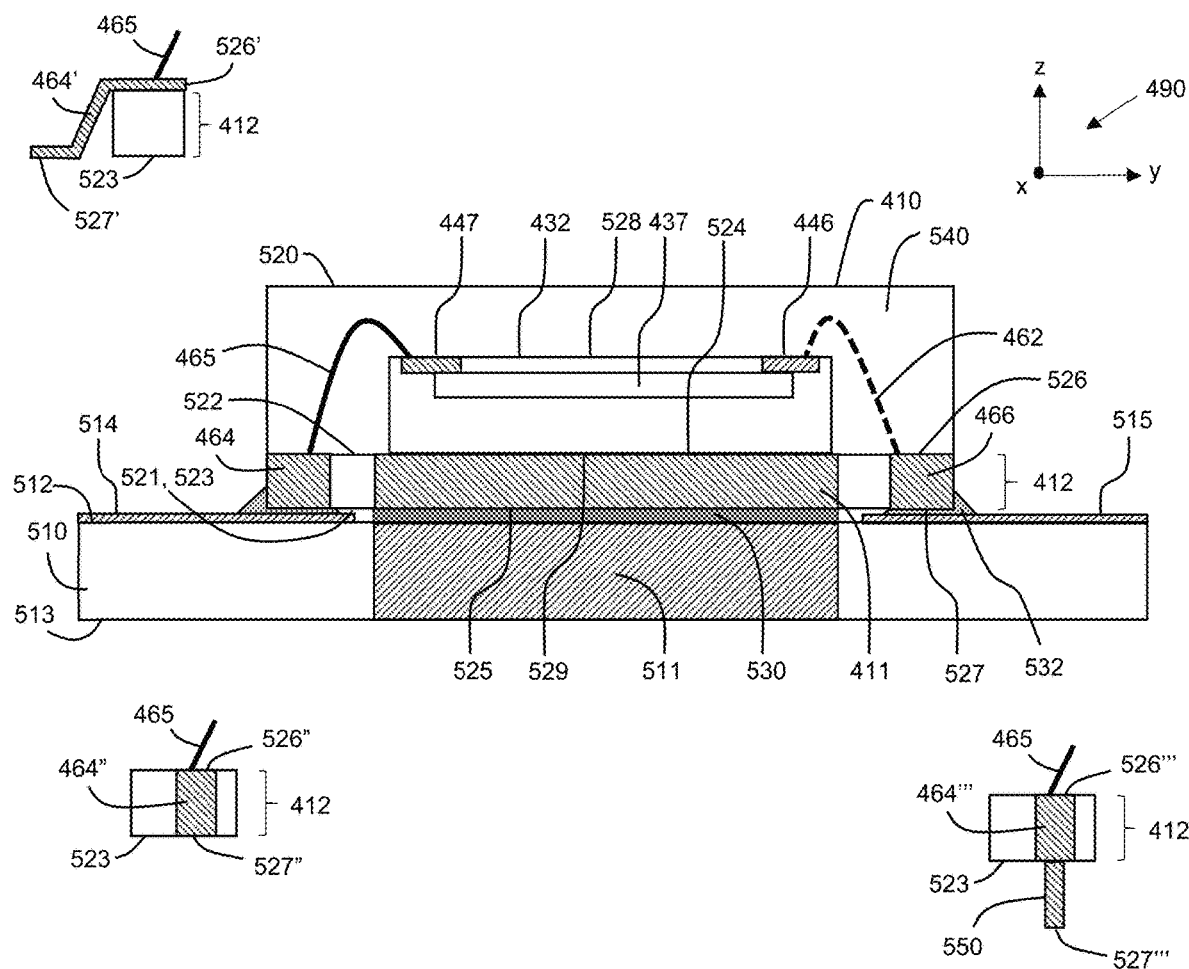
FIG. 5 is a cross-sectional, side view of the no-leads packaged amplifier device of FIG. 4 along line 5-5, which is further coupled to an amplifier module substrate, in accordance with an example embodiment.
Figure 6:
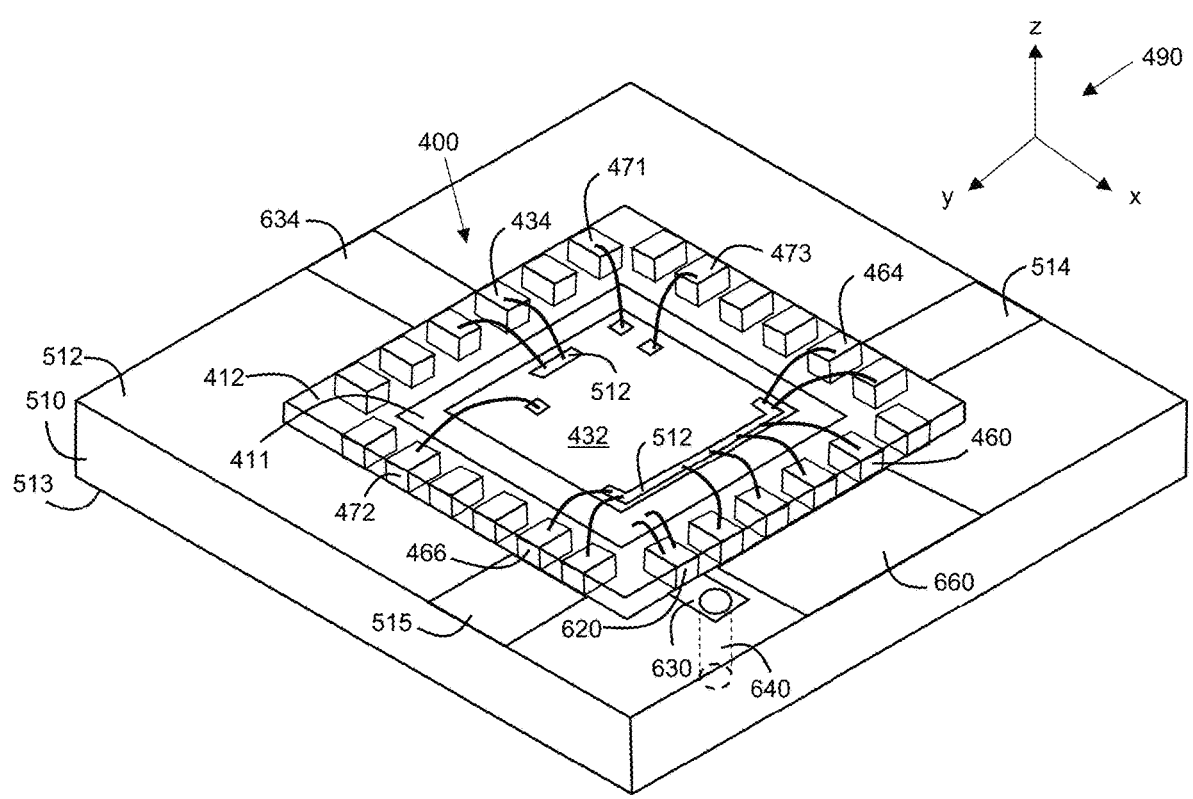
FIG. 6 is an isometric view of the no-leads packaged amplifier device and amplifier module substrate of FIG. 5, in accordance with an example embodiment.

An embodiment of a surface-mount amplifier device, variations of which are suitable for use as the carrier amplifier device 132 and the peaking amplifier device 152 in a Doherty amplifier module (e.g., Doherty amplifier 100, FIG. 1), will now be described in detail with reference to FIGS. 4-6. More specifically, FIG. 4 is a top view of a surface-mount packaged amplifier device 400, in accordance with an example embodiment, and FIG. 5 is a cross-sectional, side view of the device 400 of FIG. 4 along line 5-5. As also shown in the isometric view of FIG. 6, the surface-mount packaged amplifier device 400 may be coupled to an amplifier module substrate 510, in order to assemble the device into an amplifier module (e.g., a Doherty amplifier module). To enhance description of the relative orientations and directions of various elements of FIGS. 4-6, each of FIGS. 4-6 include a depiction of a three-dimensional Cartesian coordinate axis system 490, with orthogonal x-, y-, and z-axes depicted.

Amplifier device 400 essentially includes a surface-mount package 410, an amplifier die 432, and a plurality of wirebonds 455, 465, 462, 463 electrically coupling the amplifier die 432 to leads 434, 460, 464, 466, 471, 474 of the surface-mount package 410. As will be explained in detail below, a first variation of amplifier device 400 configured for use as a carrier amplifier (e.g., carrier amplifier 132, FIG. 1), and a second variation of amplifier device 400 used as a peaking amplifier (e.g., peaking amplifier 152, FIG. 1) may be essentially identical, except with different wirebond connections made within the package. Of course, for an asymmetrical Doherty amplifier, the relative size and/or current-carrying capacity of the amplifier dies 432 may differ between an amplifier device 400 used as a carrier or peaking amplifier, as well.

The surface-mount package 410 has a rectangular (e.g., square) perimeter defined by first, second, third, and fourth sides 413, 414, 415, 416 that extend between a top surface 520 (FIG. 5) and an opposed bottom (or substrate-facing) surface 521. The surface-mount package 410 includes a leadframe with a central thermal pad or flange 411 and a plurality of leads (e.g., leads 434, 460, 464, 466, 471, 474), which are electrically isolated from each other and held in fixed orientation with respect to each other by a lower package body 412. The lower package body 412 has opposed top and bottom surfaces 522, 523, where the top surface 522 of the lower package body 412 is internal to the package 410, and the bottom surface 523 of the lower package body 412 also corresponds to the bottom surface 521 of the overall package 410. According to an embodiment, the lower package body 412 may be formed from a molded plastic encapsulant material, although in other embodiments, the package body 412 may be formed from ceramic or another high-dielectric material.

The flange 411 is an electrically- and thermally-conductive, solid structure, which is centrally-located in the lower package body 412, and which extends between the top and bottom surfaces 522, 523 of the lower package body 412. More particularly, a top surface 524 of the flange 411 is co-planar with the top surface 522 of the lower package body 412, and a bottom surface 525 of the flange 411 is co-planar with the bottom surface 523 of the lower package body 412 (and with the bottom surface 521 of the package 410). The flange 411 may be formed, for example, from bulk conductive material (e.g., copper), which may or may not be plated. Alternatively, the flange 411 may be formed from a composite (e.g., layered or multi-part) conductive structure. A perimeter of the flange 411 (e.g., as seen from the top view of FIG. 4) generally is equal to or greater than the perimeter of the amplifier die 432 that is connected to the flange 411. As will be discussed in more detail later, the bottom surface 529 of the amplifier die 432 is physically and electrically connected (e.g., with a solder connection, conductive adhesive, brazing, sintering, or other materials) to the top surface 524 of the flange 411, and the bottom surface 525 of the flange 411 is physically and electrically connected (e.g., with solder connection 530, conductive adhesive, or other materials) to the top surface 512 of the amplifier module substrate 510, and more specifically to the top surface of a conductive coin or thermal structure 511 embedded in the substrate 510.

Sets of leads 423, 424, 425, 426 are located at or proximate to each of the four sides 413-416 of the lower package body 412. Specifically, in FIG. 4, six aligned leads 423-426 are located at each of the four sides 413-416 of the lower package body 412. Alternatively, more or fewer leads 423-426 may be located at or proximate to each of the four sides 413-416. Sometimes alternatively referred to as "lands" or "pins", each of the leads 423-426 also are formed from bulk electrically conductive material (e.g., copper), which may or may not be plated. Alternatively, the leads may be formed from a composite (e.g., layered or multi-part) conductive structure. Essentially, each lead 423-426 is a roughly cubic structure with a top surface 526 (or an "internal end" or "proximal end") that is exposed at and/or co-planar with the top surface 522 of the lower package body 412, a bottom surface 527 (or an "external end" or "distal end") that is co-planar with the bottom surface 523 of the lower package body 412 (and the bottom surface 521 of the device 400), and four side surfaces extending between the top and bottom surfaces 526, 527. The internal end (e.g., the top surface 526) of each lead 423-426 is at a height above the bottom surface 521 of the device (and thus is at a height above the top surface 512 of the module substrate 510). According to an embodiment, this height, which essentially corresponds to the thickness of the leads 423-426 (i.e., the distance between the top and bottom surfaces 526, 527 of each lead), is in a range of about 0.2 millimeters (mm) to about 0.5 mm, in an embodiment, or from about 0.3 mm to about 0.4 mm, in a more specific embodiment. The bottom surface 527 of each lead is exposed at the bottom surface 523 of the lower package body 412 (and at the bottom surface 521 of the device 400), and one of the side surfaces of each lead 423-426 may be exposed at a side 413-416 of the lower package body 412. In other embodiments, a side surface of a lead may not be exposed at a side 413-416 of the lower package body 412 (e.g., encapsulant material of the lower package body 412 may be present between the lead 423-426 and the sides 413-416 of the lower package body 412). Either way, the lead configuration ultimately facilitates robust connections (e.g., solder connections 532 or connections to a socket) of the leads to conductive structures (e.g., traces 514, 515) at the top surface 512 of the amplifier module substrate 510. In addition, the vertical package leads 423-426 contribute to providing a 90 degree impedance inverter, while allowing for optimal combining at the drain (or current source) of the peaking amplifier (e.g., peaking amplifier 752, FIGS. 7, 8). The 4-sided (quad) lead arrangement also allows for perpendicular and symmetrically balanced provision of drain bias voltages.

Considering the planes of the top surfaces 520, 528, 512 of the device package 410, the amplifier die 432, and the amplifier module substrate 510 to be "horizontal", each of the leads 423-426 may be considered to be a "vertical" conductor (or vertical inductor). As used herein, a "vertical conductor" or "vertical lead" is a conductive structure that conveys an electrical signal in a vertical direction from an internal or proximal end (e.g., the top surface 526 of a lead 423-426) that is significantly elevated above the top surface 512 of the amplifier module substrate 510 to an external or distal end (e.g., the bottom surface 527 of a lead 423-426) that is substantially at the top surface 512 of the amplifier module substrate 510. Between its proximal and distal ends, a "vertical conductor" (or vertical lead) may conduct an electrical signal in a direction that is orthogonal to (i.e., about 90 degrees offset from) or angularly offset from (e.g., offset by 30 to 90 degrees) the primary direction of signal conduction through the amplifier die 432, the plane of the top surface 528 of the amplifier die 432, and/or the plane of the top surface 512 of the amplifier module substrate 510.

As will be discussed in more detail below, each lead 423-426 (or each "vertical conductor" or "vertical lead") has a non-negligible inductance (e.g., inductance 264 or 266, FIG. 2) between its proximal and distal ends, which results in a non-negligible phase shift and impedance transformation being applied to a signal conducted between the proximal and distal ends of the lead 423-426. Accordingly, each vertical conductor (or vertical lead) also may be referred to as a "vertical inductance." In addition, because each lead 423-426 is angularly offset from (including orthogonal to) the direction of signal conduction through the amplifier die 432 (and also from the direction of signal conduction through a transmission line 176, 176' of an inverter line assembly), electromagnetic coupling between a signal conducted through the amplifier die 432 and signals conducted through a lead 423-426 or the transmission line may be minimal.

Although leads 423-426 are described to be roughly cubic structures that form portions of a leadframe, each lead 423-426 alternatively may have more or fewer than four sides, or may have shapes that are other than cubic. For example, in an alternate embodiment, rather than utilizing a QFN package (e.g., QFN package 410), the amplifier die 432 may be packaged in a Quad Flat Package (QFP). Essentially, a QFP differs from QFN package 410 in that the QFP includes gull wing leads (e.g., the gull wing lead 464' shown in the top left corner of FIG. 5, rather than bulk conductive leads 423-426 of a leadframe), which provide for electrical coupling between the amplifier die 432 and the amplifier module substrate 510. As with a QFN package, a QFP package includes a thermal pad or flange (e.g., flange 411, FIG. 4), a plurality of leads (in this case, gull wing leads, such as the gull wing lead 464' shown in the top left corner of FIG. 5), and a package body that holds the flange and the leads in a fixed orientation with respect to each other.

Each gull wing lead 464' includes an internal end 526' (analogous to the top surface 526 or internal or proximal end of leads 423-426), which is embedded in the package body and elevated above the bottom surface 523 of the lower package body 412, and an external end 527' (analogous to the bottom surface 527 or external or distal end of leads 423-426), which is external to the lower package body 412 and co-planar with the bottom surface 523 of the lower package body 412. As will be explained in more detail below, in a QFP embodiment with gull wing leads, a distal end of a wirebond (e.g., wirebonds 455, 465, 462, 463, FIG. 4) is connected to the elevated internal end 526' of each gull wing lead 464', and the external distal end 527' of the gull wing lead 464' is connected to a conductive structure (e.g., one of traces 514, 515 or other conductive structures) at the top surface 512 of the amplifier module substrate 510. Accordingly, such a gull wing lead 464' also may be considered to be a vertical conductor (i.e., a conductor that is angularly offset from or roughly orthogonal to the direction of signal conduction through the amplifier die 432 (i.e., a direction parallel to the y-axis of coordinate system 490), to the top surface 528 of the amplifier die 432, or to the top surface 512 of the amplifier module substrate 510).

In still another alternate embodiment, the lower package body 412 may include a Land Grid Array (LGA) or a Ball Grid Array (BGA) that includes an array of lands, balls, or pins at the bottom surface 523 of the lower package body 412. Two embodiments of LGA leads 464", 464"' are shown at the lower left and lower right corners of FIG. 5, respectively. LGA lead 464" is inset from the side of the lower package body 412, and extends between a top or proximal end 526" at the top surface 522 of the lower package body 412, and a bottom or distal end 527" at the bottom surface of the lower package body 412. The bottom end 527" functions as a land, that may be solder attached to a corresponding contact on the top surface of a PCB, or that may be contacted by a conductive pin protruding from the PCB. In some embodiments, such a conductive pin may protrude into the lead 464" (i.e., each lead 464" actually functions as a single-pin socket).

LGA lead 464"' also is inset from the side of the lower package body 412, and has a portion that extends between a top or proximal end 526"' at the top surface 522 of the lower package body 412 and the bottom surface 523 of the lower package body 412. However, LGA lead 464"' also includes a pin 550 that protrudes from the bottom surface 523 of the lower package body 412, and an end 527"' of the pin 550 corresponds to the bottom or distal end of the lead 464"'. The pin 550 is configured to be received by a socket coupled to a PCB.

The amplifier die 432 includes the primary amplification circuitry (e.g., amplification stages 136, 137 or 156, 157, FIG. 1) of the amplifier device 400. As mentioned above, the amplifier die 432 is physically and electrically connected to the top surface 524 of the flange 411 (e.g., using solder, conductive adhesive, brazing, sintering, or other materials). After being connected to the flange 411, electrical connections are made between conductive terminals (or pads) exposed at the top surface 528 of the amplifier die 432 and certain ones of the leads 423-426. More specifically, when the package 410 is a QFN package, first ends of wirebonds (e.g., wirebonds 455, 465, 462, 463) are connected to the conductive terminals at the top surface 528 of the amplifier die 432, and second ends of the wirebonds are connected to the top surfaces 526 (or to the internal or proximal ends) of certain ones of the leads 423-426 (e.g., to leads 434, 460, 464, 466, 471, 474). In other embodiments, as was discussed previously, the surface-mount package may be a QFP, LGA, or BGA package, and the second ends of the wirebonds are connected to the proximal ends 526', 526", 526"' of the corresponding leads 464', 464", 464"'. In some embodiments, the amplifier die 432, the wirebonds (e.g., wirebonds 455, 465, 462, 463), the top surface 522 of the lower package body 412, and the top surfaces 526 (or internal or proximal ends) of the leads 423-426 may then be overmolded with encapsulant material 540. Alternatively, a protective cap may be attached to the top surface 522 of the lower package body 412 to establish a sealed, internal air cavity that contains the amplifier die 432 and the wirebonds (e.g., wirebonds 455, 465, 462, 463). In other words, the surface-mount package 410 also may be an air-cavity QFN package (or another type of surface-mount, air cavity package).

The amplifier die 432 has a rectangular perimeter defined by first, second, third, and fourth sides 483, 484, 485, 486 that extend between the top surface 528 and opposed bottom surface 529 of the amplifier die 432. The sides 483, 484, 485, 486 of the amplifier die 432 each are parallel to device sides 413, 414, 415, 416, respectively.

The illustrated embodiment of amplifier die 432 embodies a two-stage amplifier, and each amplification stage (e.g., amplification stages 136, 137 or 156, 157, FIG. 1) includes a power transistor 436, 437. More specifically, the electrical components of amplifier die 432 include an RF input terminal 435, an integrated input matching network 456, a driver transistor 436, an integrated interstage matching network 457, a final stage transistor 437, and an RF output terminal 438 coupled in series in the above order. The driver transistor 436 is configured to apply a relatively low gain to the RF input signal, and the final stage transistor 437 is configured to apply a relatively high gain to the RF signal after preliminary amplification by the driver transistor 436. In other embodiments, the amplifier die 432 may embody a single stage amplifier, or may include more than two amplification stages.

The RF input terminal 435, which is configured to receive an RF signal for amplification, is electrically coupled to the gate terminal of transistor 436 through input matching network 456, and the drain terminal of transistor 436 is electrically coupled to the gate terminal of transistor 437 through inter-stage matching network 457. According to an embodiment, the drain terminal of transistor 437 is electrically coupled to output terminal 438. The source terminals of transistors 436, 437 are coupled to a ground reference. The signal path through the amplifier die 432 is in a direction extending from the RF input terminal 435 toward the RF output terminal 438, which direction corresponds to the x-axis of coordinate system 490. An amplified RF carrier signal is produced by the amplifier die 432 at the RF output terminal 438.

The RF input and output terminals 435, 438 each include a conductive contact that is exposed at the top surface 528 of the amplifier die 432. In addition to the conductive contacts for the RF input and output terminals 435, 438, amplifier die 432 also includes a plurality of conductive contacts that are used to provide gate and drain DC bias voltages to the driver and final stage transistors 436, 437. As is shown in FIG. 4, for example, a first conductive bias contact (lower left corner of the amplifier die 432) is electrically coupled to the gate of power transistor 436, and a gate bias voltage may be provided to the gate through lead 471 and a wirebond coupled between lead 471 and the first conductive bias contact. Similarly, a second conductive bias contact (center right side of the amplifier die 432) is electrically coupled to the drain of power transistor 436, and a drain bias voltage may be provided to the drain through lead 472 and a wirebond coupled between lead 472 and the second conductive bias contact. Finally, a third conductive bias contact (center left side of the amplifier die 432) is electrically coupled to the gate 433 of power transistor 437, and a gate bias voltage may be provided to the gate 433 through lead 473 and a wirebond coupled between lead 473 and the third conductive bias contact.

Each of the transistors 436, 437 may be a field effect transistor (FET) (such as a metal oxide semiconductor FET (MOSFET), a laterally diffused MOSFET (LDMOS FET), a high electron mobility transistor (HEMT), and so on). Accordingly, each power transistor 436, 437 includes a control terminal (e.g., a gate terminal) and first and second current-carrying terminals (e.g., a drain terminal and a source terminal). Alternatively, each of the transistors 436, 437 may be a bipolar junction transistor (BJT). References herein to a "gate," "drain," and "source," which are commonly used to describe FETs, are not intended to be limiting, as each of these designations has analogous features for BJT implementations.

In some embodiments, the semiconductor technology used for the power transistors 436, 437 in the amplifier die 432 may include silicon (e.g., the transistors 436, 437 may be silicon LDMOS FETs built on a silicon, silicon carbide, or other silicon-including substrate), while in other embodiments, the semiconductor technology used for the power FETs in the amplifier die 432 may include gallium nitride (GaN) (e.g., the transistors 436, 437 may be GaN FETs formed from GaN-including layers built on a silicon, GaN or other substrate). In still other embodiments, the driver transistor 436 may be included in a first IC, and the final stage transistor 437 may be included in a distinct, second IC. In such embodiments, both the driver and final stage amplifier dies would be coupled to the top surface 524 of the flange 411, and additional wirebonds may be used to electrically connect the drain of the driver transistor 436 with the gate of the final stage transistor 437. In such an embodiment, the driver and final stage amplifier dies may be formed from the same semiconductor technology (e.g., silicon or GaN), or the driver and final stage amplifier dies may be formed from different semiconductor technologies (e.g., the driver stage amplifier die may be formed using silicon technology, and the final stage amplifier die may be formed using GaN technology, or vice versa).

Connections between the leads 423-426 of the package 410 and the amplifier die 432 will now be described in more detail. On the input side of device 400, one or more package leads 434 corresponding to the RF input of the device 400 (e.g., input 134 or 154, FIG. 1) are electrically coupled with wirebonds 455 to the conductive contact corresponding to the RF input terminal 435 of the amplifier die 432. On the output side of device 400, the connections between package leads and the RF output terminal 438 depend on whether the device 400 is configured as a carrier amplifier or a peaking amplifier. In addition, the connections between package leads and the RF output terminal 438 depend on whether, in a Doherty amplifier module (e.g., modules 700, 800, FIGS. 7, 8), the carrier amplifier device is located to the left or to the right of the peaking amplifier device. The below description assumes that the carrier amplifier device is located generally to the right of the peaking amplifier device. Those of skill in the art would understand, based on the description herein, how to modify the connections between package leads and the RF output terminals 438 of the carrier and peaking devices in alternative configurations in which the carrier amplifier device is located generally to the left of the peaking amplifier device.

According to an embodiment, and referring to the enlarged version of transistor 437 on the right side of FIG. 4, the RF output terminal 438 is shaped to enable two sets of wirebonds (for a carrier amplifier) or three sets of wirebonds (for a peaking amplifier) to extend from the die 432 in angularly offset directions from each other. More specifically, the RF output terminal 438 includes a conductive first side pad 446 that is proximate to the second side 414 of the amplifier die 432, an elongated central pad 445 that is proximate to the third side 415 of the amplifier die 432, and a conductive second side pad 447 that is proximate to the fourth side 416 of the amplifier die 432.

As will be better understood in the discussion of FIGS. 7 and 8, when the device 400 is configured as a carrier amplifier (e.g., carrier amplifier 132, 732, 832, FIGS. 1, 7, 8) positioned to the right of the peaking amplifier, one or more package leads 464 corresponding to the RF output of the device (e.g., output 164, FIG. 1) may be electrically coupled with wirebonds 465 to the second side pad 447 of the RF output terminal 438, and the amplified carrier signal may be conveyed through the second side pad 447, wirebonds 465, and leads 464. As indicated in FIG. 4, the wirebonds 465 extend in a direction that is orthogonal to the primary direction of the signal path through the amplifier die 432. In other words, whereas the primary direction of the signal path through the amplifier die 432 is between terminals 435 and 438 (i.e., parallel with the x-axis of coordinate system 490), wirebonds 465 extend in an orthogonal direction (i.e., parallel with the y-axis of coordinate system 490). As will be explained in more detail below, when device 400 is used as the carrier amplifier in a Doherty power amplifier, the package lead(s) 464 and the wirebonds 465 each form portions of the inverter line assembly between the output of the carrier amplifier and the combining node. One or more other package leads 460 are electrically coupled to the elongated central pad 445 of the RF output terminal 438 through wirebonds 463, so that a drain bias voltage may be provided to the drain of power transistor 437 through the lead(s) 460, wirebonds 463, and the elongated central pad 445 of the RF output terminal 438.

When the device 400 is configured as a peaking amplifier (e.g., peaking amplifier 152, 752, 852, FIGS. 1, 7, 8) positioned to the left of the carrier amplifier, package leads 460 corresponding to the RF output of the device (e.g., output 160, FIG. 1) are electrically coupled with wirebonds 463 to the elongated central pad 445 of the RF output terminal 438. As will be explained in more detail in conjunction with FIGS. 7 and 8, the RF output terminal 438 of the peaking amplifier also corresponds to the combining node (e.g., combining node 180, FIG. 1) of a Doherty amplifier in which device 400 is included, and the combined, amplified, carrier and peaking signals may be conveyed through the elongated central pad 445, wirebonds 463, and leads 460. Conversely, package leads 464 are electrically coupled to the second side pad 447 of the RF output terminal 438 through wirebonds 465, so that a drain bias voltage may be provided to the drain of power transistor 437 through the lead(s) 464, wirebonds 465, and RF output terminal 438.

Because the combining node functions to combine the RF signals produced by both the peaking amplifier and the carrier amplifier, when the device 400 is configured as a peaking amplifier, device 400 also includes connections configured to receive the amplified carrier signal from the carrier amplifier. More specifically, when the device 400 is configured as a peaking amplifier, one or more package leads 466, which are coupled to the first side pad 446 of the RF output terminal 438 through wirebonds 462, may correspond to an additional input to device 432 that is configured to convey the amplified carrier signal to the RF output terminal 438 (and thus to the combining node). As indicated in FIG. 4, the wirebonds 462 extend in a direction that is orthogonal to the primary direction of the signal path through the amplifier die 432. Once again, whereas the primary direction of the signal path through the amplifier die 432 is between terminals 435 and 438 (i.e., parallel with the x-axis of coordinate system 490), wirebonds 462 extend in an orthogonal direction (i.e., parallel with the y-axis of coordinate system 490). As will be explained in more detail below, when device 400 is used as the peaking amplifier in a Doherty power amplifier, the package lead(s) 466 and the wirebonds 462 each form portions of the inverter line assembly between the output of the carrier amplifier and the combining node. Wirebonds 462 are shown as dashed lines in FIG. 4, as they are only included when device 400 is configured as a peaking amplifier, and are excluded when device 400 is configured as a carrier amplifier.

The first and second side pads 446, 447 each have a length (dimension along the x-axis of coordinate system 490) that extends in parallel with the second side 484 or fourth side 486, respectively, of the amplifier die 432. According to an embodiment, the length of each of the side pads 445, 447 is large enough to enable a plurality of wirebonds (e.g., from 2 to 10 or more) to be connected in parallel with each other along the length of the first or second side pad 445, 447. As shown in FIG. 4, the lengths of the side pads 445, 447 are large enough to enable the plurality of wirebonds 465, 462 to be connected so that they can extend in perpendicular directions from sides 486, 484, respectively.

FIG. 4 shows two wirebonds 465 connected in parallel with each other to side pad 447, and two wirebonds 462 connected in parallel with each other to side pad 446. In alternate embodiments, the lengths of the side pads 446, 447 may be sufficient to enable fewer (e.g., as few as one) or more (e.g., 10 or more) wirebonds to be connected in parallel along the lengths of the side pads 446, 447. For example, the lengths may be in a range of about 200 microns to about 400 microns, although the lengths may be smaller or larger, as well. Side pads 446, 447 each also have a width (dimension along the y-axis of coordinate system 490) that is sufficient to enable at least one row of wirebonds 465, 462 to be coupled to each of the side pads 446, 447. For example, the widths may be in a range of about 100 microns to about 150 microns, although the widths may be smaller or larger, as well.

The elongated central pad 445 of RF output terminal 438 is electrically coupled to the elongated side pads 446, 447. More specifically, a first end of central pad 445 is electrically coupled to the first side pad 446, and a second end of central pad 445 is electrically coupled to the second side pad 447. The elongated central pad 445 is proximate to the third side 485 of the amplifier die 432, in an embodiment, and the elongated central pad 445 has a length (dimension along the y-axis of coordinate system 490) that extends in parallel with the third side 485. According to an embodiment, the side pads 446, 447 and the central pad 445 have lengths that are perpendicular to each other. The length of the central pad 445 is large enough to enable a third plurality of wirebonds 463 to be connected in parallel along the length of the central pad 445. As shown in FIG. 4, the length of the central pad 445 is large enough to enable the plurality of wirebonds 463 to be connected so that they can extend in a perpendicular direction from side 485. FIG. 4 shows four wirebonds 463 connected in parallel with each other. In alternate embodiments, the length of the central pad 445 may be sufficient to enable more (e.g., 20 or more) wirebonds to be connected in parallel along the length of the central pad 445. According to an embodiment, the length may be in a range of about 800 microns to about 1800 microns, or more desirably in a range of about 1500 microns to about 1800 microns, although the length may be smaller or larger, as well.

In an embodiment, the side pads 446, 447 and central pad 445 are integrally formed together as a portion of a same conductive layer (e.g., a metal-5 (M5) layer in a 5-layer device). In alternate embodiments, the side pads 446, 447 and central pad 445 may be formed from different portions of a single conductive layer, and electrically connected together through conductive vias, portions of other conductive layers, wirebonds, or other types of electrical conductors. Alternatively, the side pads 446, 447 and central pad 445 may be formed from electrically connected portions of multiple conductive layers.

In the embodiment illustrated in FIG. 4, the terminals 435, 438 of the amplifier die 432 are electrically coupled to leads 434, 460, 464, 466 with wirebonds (e.g., wirebonds 455, 463, 464, 466). In other embodiments, the amplifier die 432 may be a "flip-chip" type of die, and the top surface of the die 432 may be directly connected to the top surface of the lower package body 412. In such an embodiment, terminals 435, 438 may be replaced with land-type terminals, and the wirebonds 455, 463, 464, 466 may be replaced with traces on the top surface of the lower package body 412 to interconnect the land-type terminals with the leads 434, 460, 464, 466.

As previously indicated, two instances of amplifier device 400 may be surface mounted to an amplifier module substrate to utilize the amplifier devices as a carrier amplifier (e.g., carrier amplifier 132, FIG. 1) and a peaking amplifier (e.g., peaking amplifier 152, FIG. 1) of a Doherty amplifier module. Before describing embodiments of Doherty amplifier modules in detail in conjunction with FIGS. 7 and 8, FIG. 6 is provided to show details of how an amplifier device 400 (with overmolding removed) may be coupled to the top surface 512 of an amplifier module substrate 510, and how electrical connections may be made between the device leads and conductive traces (e.g., transmission lines) on the top surface 512 of the amplifier module substrate 510. In FIG. 6, RF input leads 434 are electrically connected to a first conductive trace 634 on the top surface 512 of module substrate 510, and RF output leads 460 are electrically connected to a second conductive trace 660 on the top surface 512 of module substrate 510. Further, final stage gate bias leads 464 are electrically connected to a third conductive trace 514 on the top surface 512 of module substrate 510. Additional input leads 466 (for receiving the amplified carrier signal) are electrically connected to a fourth conductive trace 515 on the top surface 512 of module substrate 510. Gate and drain bias leads 471-473 may be electrically connected to additional conductive traces (not shown) on the top surface 512 of module substrate 510, which are configured to convey DC gate and drain bias voltages through the leads 471-473 to the amplifier die 432. As shown in FIG. 6, according to an embodiment, the flange 411 also may be coupled to one or more leads (e.g., lead 620) through additional wirebonds (not numbered), and lead 620, in turn, may be electrically coupled to additional conductive trace(s) 630 and through substrate via(s) 640 (i.e., conductive via(s) extending between the substrate top and bottom surfaces 512, 513) to provide an electrical connection between the flange 411 and a ground reference provided at the bottom surface 513 of the module substrate 510. Alternatively, the module substrate 510 may include a ground/heatsink structure (e.g., a conductive coin, conductive vias, or other heatsink structures) in contact with and underlying the flange 411. The physical attachments and electrical connections between the leads 434, 460, 464, 464', 464", 464"', 466, 471-473, 620 and the conductive traces 514, 515, 630, 634, 660 may be made using solder (e.g., solder 532, FIG. 5) or conductive adhesive, for example, or in the case of an LGA type of package with pins (e.g., pins 550, FIG. 5), the pins may be received by a socket coupled to the PCB.

Two embodiments of Doherty amplifier modules will now be described in conjunction with FIGS. 7 and 8. For brevity, the common or similar components of FIGS. 7 and 8 will be discussed together. More specifically, FIG. 7 is a top view of a Doherty amplifier module 700 with surface mount carrier and peaking amplifier devices 732, 752 oriented in an angularly offset (e.g., perpendicular, orthogonal) arrangement, and FIG. 8 is a top view of a Doherty amplifier module 800 with surface mount carrier and peaking amplifier devices 732, 752 oriented in a parallel arrangement, in accordance with two example embodiments.

Doherty amplifier modules 700, 800 each include an amplifier module substrate 710, RF input and output connectors 712, 714, a power splitter 720 (e.g., power splitter 120, FIG. 1), a carrier amplifier device 732 (e.g., carrier amplifier device 132, 400, FIGS. 1, 4), a peaking amplifier device 752 (e.g., peaking amplifier device 152, 400, FIGS. 1, 4), a phase shift and impedance inverter line assembly 772, 872 (e.g., impedance inverter line assembly 172, 272, FIGS. 1, 2), and various other circuit elements, which will be discussed in more detail below.

The amplifier module substrate 710 may be, for example, a printed circuit board (PCB) or another type of substrate. Substrate 710 has a top substrate surface 711 (or a component mounting surface) and an opposed bottom substrate surface. In some embodiments, the substrate 710 may be a multi-layer organic substrate (e.g., formed from PCB materials) with a plurality of metal layers, where adjacent metal layers are separated by dielectric material. According to an embodiment, a metal layer on the bottom substrate surface may be coupled to an external ground voltage reference when the Doherty amplifier module 700, 800 is integrated within a larger electrical system. Accordingly, system ground may be established through electrical connections (e.g., conductive through substrate vias) between a system component at or on the top substrate surface 711 and the metal layer on the bottom substrate surface.

A metal layer formed on the top substrate surface 711 is patterned to provide a plurality of conductive traces and contacts (or pads) on the top substrate surface 711. These traces and contacts provide electrical connections to and between the RF input and output connectors 712, 714, the input splitter 720, the carrier and peaking amplifier devices 732, 752, and other components that may be coupled to the top substrate surface 711. In addition, one or more portions of an impedance inverter line assembly 772, 872, described in more detail later, may be formed from one or more portions of the patterned metal layer on the top substrate surface 711. In a particular embodiment, for example, a transmission line 774 (or 774'), 874 of the impedance inverter line assembly 772, 872 may be formed from a portion of the patterned top metal layer. Conductive vias (e.g., via 640, FIG. 6) provide for electrical connectivity between the metal layers of the substrate 710, including between the patterned metal layer on the top substrate surface 711, and the metal layer on the bottom substrate surface.

Each of the carrier and peaking amplifier devices 732, 752 are surface-mount devices (e.g., variants of amplifier device 400, FIGS. 4-6), which are physically coupled to the top substrate surface 711, and which have leads (e.g., leads 716, 734, 754, 760, 764, 766, 765) with bottom surfaces (or distal ends) that are physically and electrically connected to conductive pads and traces at the top surface of the substrate 710 (e.g., formed from the top metal layer of the substrate 710). Because each of the carrier and peaking amplifier devices 732, 752 need access to a ground reference, substrate 710 may include an embedded conductive coin or conductive through-substrate vias underlying each device 732, 752, and extending between the top substrate surface 711 and the bottom substrate surface. In addition or alternatively, the ground reference may be accessed through one or more of the device leads (e.g., lead 620, FIG. 6).

The RF input connector 712 and the RF output connector 714 are coupled to sides of the substrate 710. The RF input connector 712 corresponds to an RF input (e.g., RF input 112, FIG. 1) for the module 700, 800, and accordingly is configured to receive an RF input signal for amplification when the RF input connector 712 is coupled to an external RF signal source. The RF output connector 714 corresponds to an RF output (e.g., RF output 114, FIG. 1) for the module 700, 800, and accordingly is configured to provide an amplified RF signal to a load (e.g., an antenna) to which the RF output connector 714 is coupled.

The RF input connector 712 is electrically coupled to an input 722 (or a first port) of the power splitter 720. The power splitter 720 may be a discretely-packaged component mounted to the top substrate surface 711, in one embodiment, or may be implemented using lumped components and/or conductive traces on the top substrate surface 711. Either way, the power splitter 720 is configured to divide the power of an RF input signal into carrier and peaking portions of the input signal (i.e., the carrier RF input signal and the peaking RF input signal). In addition, the power splitter 720 may include one or more phase shift elements configured to impart about a 90 degree phase shift difference between the RF signals provided at output terminals 724, 726. In an embodiment, a conductive trace 781 or transmission line on the top substrate surface 711 electrically connects the RF input connector 712 to input 722 (e.g., input 122, FIG. 1) of the power splitter 720, in order to receive the RF input signal from the RF input connector 712. A second port 723 of the power splitter 720 may be coupled to ground (e.g., through a 50 ohm termination). The carrier RF input signal is provided to the carrier amplifier path at power splitter output 724 (or a third port, e.g., splitter output 124, FIG. 1), and the peaking RF input signal is provided to the peaking amplifier path at power splitter output 726 (or a fourth port, e.g., splitter output 126, FIG. 1). The carrier and peaking RF signals may have equal or unequal power, as discussed previously.

The carrier RF signal produced at power splitter output 724 is amplified through a carrier amplifier path (e.g., path 130, FIG. 1), and the peaking RF signal produced at power splitter output 726 is amplified through a peaking amplifier path (e.g., path 150, FIG. 1). The carrier amplifier path includes conductive trace 782, carrier amplifier device 732, and impedance inverter line assembly 772, 872. The carrier RF signal produced at power splitter output terminal 724 is conveyed through conductive trace 782 to carrier amplifier device 732, in order to provide an RF carrier signal for amplification to the carrier amplifier device 732. An input impedance matching circuit (e.g., circuit 170, FIG. 1, not shown in FIGS. 7, 8) may be coupled (e.g., along trace 782) between the power splitter output terminal 724 and the carrier amplifier device 732. The input impedance matching circuit may include a plurality of discrete and/or integrated components (e.g., inductors and capacitors) configured to provide proper impedance matching between the first power splitter output 724 and the input to the carrier amplifier device 732.

As discussed in FIG. 4, the carrier amplifier device 730 has a lower package body (e.g., lower package body 412, FIGS. 4, 5) with an outer perimeter defined by first, second, third, and fourth sides 713, 714, 715, 716 (e.g., sides 413-416, FIG. 4). The carrier amplifier device 730 further has a plurality of leads 734, 760, 764, an amplifier die 732, and electrical connections between the amplifier die 732 and the leads 734, 760, 764.

According to an embodiment, the bottom surfaces (or distal ends) of one or more first package leads 734 (e.g., package leads 434, FIG. 4) at the first side 713 of device 730 are connected (e.g., with solder or conductive adhesive, or through a socket) to trace 782, and the top surfaces (or proximal ends) of the first package leads 734 are electrically coupled (e.g., through wirebonds 455, FIG. 4) to a conductive contact corresponding to the RF input terminal of the amplifier die 732 (e.g., RF input terminal 435, FIG. 4). A carrier RF signal received through leads 734 is then amplified through one or more power transistors (e.g., transistors 436, 437, FIG. 4), and the amplified carrier RF signal is produced at the RF output terminal (e.g., RF output terminal 438, FIG. 4). In the embodiments of both FIGS. 7 and 8, the RF output terminal is electrically coupled (e.g., through wirebonds 461, FIG. 4) to the top surfaces (or proximal ends) of one or more second package leads 764 (e.g., package leads 464, FIG. 4) at the fourth side 716 of device 730. In a more specific embodiment, the RF output terminal has an elongated portion (e.g., elongated portion 445, FIG. 4) that extends parallel to a third side 715 of device 730, and a side pad (e.g., side pad 447, FIG. 4) that is integrally formed with or electrically coupled to the elongated portion. The side pad has a length that extends in parallel with the fourth side 716 of the device 730, and which is sufficient to enable multiple wirebonds to be connected between the side pad and the package leads 764.

The bottom surfaces (or distal ends) of the second package lead(s) 764 are connected (e.g., with solder or conductive adhesive, or through a socket) to the proximal end of inverter line 774 (or 774'), 874. As will be described in more detail later, the wirebonds coupled to leads 764, the leads 764 themselves, and inverter line 774 (or 774'), 874 form portions of the inverter line assembly 772, 872 between the carrier and peaking devices 730, 750, and more specifically between the output of the carrier amplifier and the combining node 780 (e.g., combining node 180, FIG. 1).

The inverter line 774 (or 774'), 874 has a proximal end connected to leads 764 of the carrier amplifier device 730, and a distal end connected to leads 766 of the peaking amplifier device 750. According to an embodiment, the inverter line 774 (or 774'), 874 (e.g., trace 176, 176', FIG. 1, or trace 276, FIG. 2) is a transmission line, in an embodiment, that includes a conductor (over a ground plane) formed from a portion of the patterned metal layer on the top substrate surface 711. In module 700 in which the carrier and peaking amplifier devices 730, 750 are oriented orthogonally to one another, one embodiment of the inverter line 774 is "L-shaped", with a first leg extending orthogonally to the fourth side 716 of the carrier amplifier device 730, and a second leg (attached to the first leg) extending orthogonally to the second side 774 of the peaking amplifier device 750. In an alternate embodiment, the inverter line 774' of module 700 may extend straight from the fourth side 716 (and leads 764) of the carrier amplifier device 730 to the second side 774 (and leads 766) of the peaking amplifier device 750. In module 800 in which the carrier and peaking amplifier devices 730, 750 are oriented in parallel with each other, the inverter line 874 also may extend straight from the fourth side 716 (and leads 764) of the carrier amplifier device 730 to the second side 774 (and leads 766) of the peaking amplifier device 750. In either the orthogonally-oriented or the parallel-oriented embodiments of modules 700, 800, the inverter line may have other shapes as well, in order to achieve a desired electrical length between its proximal and distal ends, as will be discussed below.

Moving back to the power splitter 720, the peaking amplifier path includes conductive trace 785 and peaking amplifier device 752. The peaking RF signal produced at power splitter output terminal 726 is conveyed through conductive trace 785 to peaking amplifier device 752, in order to provide an RF peaking signal for amplification to the peaking amplifier device 752. An input impedance matching circuit (e.g., circuit 171, FIG. 1, not shown in FIGS. 7, 8) may be coupled (e.g., along trace 785) between the power splitter output terminal 726 and the peaking amplifier device 752. The input impedance matching circuit may include a plurality of discrete and/or integrated components (e.g., inductors and capacitors) configured to provide proper impedance matching between the second power splitter output 726 and the input to the peaking amplifier device 752.

As with the carrier amplifier device 730, the peaking amplifier device 750 has a lower package body (e.g., lower package body 412, FIGS. 4, 5) with an outer perimeter defined by first, second, third, and fourth sides 773, 774, 775, 776 (e.g., sides 413-416, FIG. 4). The peaking amplifier device 750 further has a plurality of leads 754, 761, 765, 766, an amplifier die 752, and electrical connections between the amplifier die 752 and the leads 754, 761, 765, 766.

According to an embodiment, the bottom surfaces (or distal ends) of one or more first package leads 754 (e.g., package leads 434, FIG. 4) at the first side 773 of peaking amplifier device 750 are connected (e.g., with solder or conductive adhesive, or through a socket) to trace 785, and the top surfaces (or proximal ends) of the first package leads 754 are electrically coupled (e.g., through wirebonds 455, FIG. 4) to a conductive contact corresponding to the RF input terminal of the amplifier die 752 (e.g., RF input terminal 435, FIG. 4). A peaking RF signal received through leads 754 is then amplified through one or more power transistors (e.g., transistors 436, 437, FIG. 4), and the amplified peaking RF signal is produced at the RF output terminal (e.g., RF output terminal 438, FIG. 4).

As discussed previously, the RF output terminal (e.g., RF output terminal 438, FIG. 4) of the peaking amplifier die 752 also corresponds to the combining node (e.g., combining node 180, FIG. 1) of the Doherty amplifier module 700, 800, at which the amplified carrier and peaking RF signals are combined. To receive the amplified carrier signal, the bottom surfaces (or distal ends) of the second package lead(s) 766 are connected (e.g., with solder or conductive adhesive, or through a socket) to the distal end of inverter line 774 (or 774'), 874. The top surfaces (or proximal ends) of the second package lead(s) 766 are electrically coupled (e.g., through wirebonds 462, FIG. 4) to the RF output terminal of the peaking amplifier die 752. In a more specific embodiment, the RF output terminal has an elongated portion (e.g., elongated portion 445, FIG. 4) that extends parallel to a third side 775 of device 750, and a side pad (e.g., side pad 446, FIG. 4) that is integrally formed with or electrically coupled to the elongated portion. The side pad has a length that extends in parallel with the second side 774 of the device 750, and which is sufficient to enable multiple wirebonds to be connected between the side pad and the package leads 766. As will be described in more detail later, the wirebonds coupled to leads 766, along with the leads 766 themselves, also form portions of the inverter line assembly 772, 872 between the peaking and peaking devices 750, 750, and more specifically between the output of the peaking amplifier and the combining node 780 (e.g., combining node 180, FIG. 1).

To summarize, the impedance inverter line assembly 772, 872 includes a plurality of components coupled in series. Along with the drain-source capacitances (e.g., capacitances 234, 254, FIG. 2) at the final-stage transistors of the carrier and peaking dies 732, 752, each of the series-coupled components contributes to the approximately 90 degree phase shift of the RF signal conveyed between the drains of the carrier and peaking final-stage transistors (or between the drain of the carrier final-stage transistor and the combining node 780). The phase shifts imparted on the RF output signal between the proximal and distal ends of each series-coupled component (due to their electrical lengths and impedances) are listed below, assuming that the fundamental operating frequency, $f_0$, of the module 700, 800 is in a range of about 800 megahertz (MHz) to about 5.2 gigahertz (GHz). Of course, the fundamental operating frequency may be lower or higher, as well. According to an embodiment, the series-coupled components of the impedance inverter line assemblies 772, 872 (and their associated phase shifts) include:

- a first interconnection (e.g., wirebond(s) 465, FIG. 4) between the output terminal (e.g., the drain terminal) of the carrier final-stage transistor and lead(s) 764. Between its proximal and distal ends, this first interconnection is characterized by a first electrical length (and provide a first phase shift) in a range of about 3 degrees to about 24 degrees, and a inductance value in a range of about 0.5 nH to about 1.0 nH (e.g., about 0.75 nH), although the first electrical length/phase shift/inductance value may be smaller or larger, as well;
- one or more first "vertical" leads 764. Between the proximal and distal ends (e.g., between proximal ends 526, 526', 526", 526''' and distal ends 527, 527', 527", 527''') of the lead(s) 764, the lead(s) 764 is characterized by a second electrical length (and provide a second phase shift) in a range of about 2 degrees to about 16 degrees, and an inductance value in a range of about 0.25 nH to about 0.75 nH (e.g., about 0.5 nH), although the second electrical length/phase shift/inductance value may be smaller or larger, as well;
- the impedance inverter line 774 (or 774'), 874 with a proximal end connected to vertical lead(s) 764 and a distal end connected to vertical lead(s) 766. Between its proximal and distal ends, the impedance inverter line 774 (or 774'), 874 is characterized by a third electrical length (and provide a third phase shift) in a range of about 10 degrees to about 80 degrees (i.e., whatever electrical length results in a 90 degree total electrical length between the carrier and peaking drain terminals, taking the drain-source capacitances of the carrier and peaking amplifiers into account), although the third electrical length/phase shift may be smaller or larger, as well;
- one or more second "vertical" leads 766. Between the proximal and distal ends (e.g., between proximal ends 526, 526', 526", 526''' and distal ends 527, 527', 527", 527''') of the lead(s) 766, the lead(s) 766 is characterized by a fourth electrical length (and provide a fourth phase shift) in a range of about 2 degrees to about 16 degrees, and an inductance value in a range of about 0.25 nH to about 0.75 nH (e.g., about 0.5 nH), although the fourth electrical length/phase shift/inductance value may be smaller or larger, as well; and
- a second interconnection (e.g., wirebond(s) 462, FIG. 4) between lead(s) 766 and the output terminal (e.g., the drain terminal) of the peaking final-stage transistor (or the combining node 780). Between its proximal and distal ends, this second interconnection is characterized by a fifth electrical length (and provide a fifth phase shift) in a range of about 3 degrees to about 24 degrees, and an inductance value in a range of about 0.5 nH to about 1.0 nH (e.g., about 0.75 nH), although the fifth electrical length/phase shift/inductance value may be smaller or larger, as well.

Those of skill in the art would understand, based on the description herein, that the ability to alter the first, second, fourth, and fifth electrical lengths/phase shifts may be somewhat limited. However, the physical and electrical length of the impedance inverter line (i.e., the third electrical length/phase shift, above) may be readily adjusted to ensure that the total electrical length/phase shift of the impedance inverter line assembly 772, 872 (including the effects of the drain-source capacitances (e.g., capacitances 234, 254, FIG. 2) at the final-stage transistors of the carrier and peaking dies 732, 752) is approximately 90 degrees.

The physical and electrical length of the impedance inverter line (i.e., the third electrical length/phase shift, above) also may be affected by coupling the RF output terminals (or the drain terminals of the final-stage transistors) of the carrier and peaking dies 732, 752 to bias and shunt circuits 790, 791, according to an embodiment. The bias and shunt circuits 790, 791 may have two functions, which include providing DC bias voltages to the RF output terminals, and resonating out at least some of the drain-source capacitances (e.g., capacitances 234, 254, FIG. 2) of the final-stage transistors of the carrier and peaking amplifier dies 732, 752. More specifically, the RF output terminals may be coupled through wirebonds (e.g., wirebonds 463 or 465, FIG. 4, respectively) and leads 760, 765 to traces 783, 786. According to an embodiment, traces 783, 786 each correspond to an RF cold point node, and thus traces 783, 786 may be used to provide DC bias voltages to the drain terminals of the final-stage transistors of carrier and peaking dies 732, 752. To receive the DC bias voltages, traces 783, 786 are coupled to drain bias voltage connections 717, 718. The drain bias voltage connections 717, 718, in turn, may be connected to external bias voltage sources. Although not shown in FIGS. 7 and 8, additional traces and connectors may be included in each module 700, 800 to provide gate bias voltages to the driver and final-stage transistors, and to the drain of the driver transistors (if included).

The inductances of the wirebonds (e.g., wirebonds 463 or 465, FIG. 4), leads 760, 765 (e.g., leads 460 or 464, FIG. 4), and traces 783, 786 may form an inductive portion of shunt circuits 790, 791. According to an embodiment, the wirebonds, leads 760, 765, and traces 783, 786 are configured to provide an inductance that is sufficient to resonate out at least some of the drain-source capacitance of the final-stage transistors of the carrier and peaking amplifier dies 732, 752. This may enable the electrical and physical length of the impedance inverter line 774 (or 774'), 874 to be increased, in comparison with the electrical and physical length that may be selected if the shunt circuits 790, 791 were excluded from the modules 700, 800. For example, the series combination of the wirebonds, leads 760, 765, and traces 783, 786 may be configured to have an inductance value in a range of about 0.25 nH to about 0.75 nH, although the series inductance may be smaller or larger, as well.

The shunt circuits 790, 791 each also include a capacitor 793, 795 (e.g., a chip capacitor) with a first terminal coupled to trace 783, 786, and a second terminal coupled to an additional trace 784, 787 which, in turn, may be connected to a ground reference voltage. Each shunt capacitor 793, 795 has a capacitance value that is chosen to provide a virtual ground reference voltage for the RF electrical signals at conductive traces 783, 786, such that the wirebonds, leads 760, 765, and traces 783, 786 function as a shunt inductance to the RF ground voltage. Desirably, the shunt capacitor 793, 795 is series resonant in band. For example, each shunt capacitor 793, 795 may have a capacitance value in a range of about 5.6 picofarads (pF) to about 33.0 pF, or more specifically in a range of about 8.0 pF to about 12.0 pF, although the capacitance value may be smaller or larger, as well.

In the embodiments of both FIGS. 7 and 8, the RF output terminal of the peaking amplifier die 752 (or combining node 780) is electrically coupled (e.g., through wirebonds 463, FIG. 4) to the top surfaces (or proximal ends) of one or more third package leads 761 (e.g., package leads 460, FIG. 4) at the third side 775 of device 750. In a more specific embodiment, the RF output terminal has an elongated portion (e.g., elongated portion 445, FIG. 4) that extends parallel to the third side 775 of device 750, and the wirebonds (e.g., wirebonds 463, FIG. 4) between the RF output terminal and the leads 761 are coupled between the elongated portion of the RF output terminal and the leads 761.

Leads 761 are electrically coupled (e.g., with solder or conductive adhesive, or through a socket) to conductive output traces 788, 789 at the top surface 711 of the module substrate 710, and trace 789, in turn, is coupled to RF output connector 714. An output impedance matching network (not shown) and/or a decoupling capacitor 792 may be coupled along output traces 788, 789, in an embodiment. The output impedance matching network functions to present the proper load impedance to combining node 780. Although not shown in FIGS. 7, 8, the output impedance matching network may include various discrete and/or integrated components (e.g., capacitors, inductors, and/or resistors) to provide the desired impedance matching.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A Doherty amplifier comprising:
   a module substrate having a top substrate surface;
   a first surface-mount device coupled to the top substrate surface, wherein the first surface-mount device includes a first plurality of leads, a first package body that is distinct from the module substrate and that holds the first plurality of leads in a fixed orientation with respect to each other, a first amplifier die connected to the first package body, and first electrical conductors electrically coupling the first amplifier die to the first plurality of leads;
   a second surface-mount device coupled to the top substrate surface, wherein the second surface-mount device includes a second plurality of leads, a second package body that is distinct from the module substrate and from the first package body and that holds the second plurality of leads in a fixed orientation with respect to each other, a second amplifier die connected to the second package body, and second electrical conductors electrically coupling the second amplifier die to the second plurality of leads; and an impedance inverter line assembly electrically connected between outputs of the first and second amplifier dies, wherein the impedance inverter line assembly includes
an impedance inverter line coupled to the module substrate, wherein the impedance inverter line has a proximal end and a distal end,
a first lead of the first plurality of leads of the first surface-mount device with a proximal end electrically coupled to an output of the first amplifier die, and a distal end coupled to the proximal end of the impedance inverter line, and
a second lead of the second plurality of leads of the second surface-mount device with a proximal end electrically coupled to an output of the second amplifier die, and a distal end coupled to the distal end of the impedance inverter line.

2. The Doherty amplifier of claim 1, wherein the first and second leads are selected from Quad Flat No-Lead (QFN) package leads, gull wing leads, Land Grid Array (LGA) package leads, and Ball Grid Array (BGA) package leads.

3. A Doherty amplifier comprising:
a module substrate having a top substrate surface;
a first surface-mount device coupled to the top substrate surface, wherein the first surface-mount device includes a first amplifier die;
a second surface-mount device coupled to the top substrate surface, wherein the second surface-mount device includes a second amplifier die; and
an impedance inverter line assembly electrically connected between outputs of the first and second amplifier dies, wherein the impedance inverter line assembly includes
an impedance inverter line coupled to the module substrate, wherein the impedance inverter line has a proximal end and a distal end,
a first lead of the first surface-mount device with a proximal end electrically coupled to an output of the first amplifier die, and a distal end coupled to the proximal end of the impedance inverter line, and
a second lead of the second surface-mount device with a proximal end electrically coupled to an output of the second amplifier die, and a distal end coupled to the distal end of the impedance inverter line, and
wherein a first electrical length between the proximal and distal ends of the first lead is in a range from 2 degrees to 16 degrees, a second electrical length between the proximal and distal ends of the impedance inverter line is in a range from 10 degrees to 80 degrees, a third electrical length between the proximal and distal ends of the second lead is in a range from 2 degrees to 16 degrees, and a total electrical length between the outputs of the first and second amplifier dies includes the first, second, and third electrical lengths, and the total electrical length is 90 degrees at a fundamental frequency of operation of the Doherty amplifier.

4. The Doherty amplifier of claim 1, wherein the proximal ends of the first and second leads are electrically coupled to the outputs of the first and second amplifier dies respectively with the first and second electrical conductors, and wherein the first and second electrical conductors comprise wirebonds.

5. The Doherty amplifier of claim 1, wherein:
the first lead is a first vertical conductor that conducts a first electrical signal between the proximal and distal ends of the first lead in a direction that is angularly offset from a primary direction of signal conduction through the first amplifier die; and
the second lead is a second vertical conductor that conducts a second electrical signal between the proximal and distal ends of the second lead in a direction that is angularly offset from a primary direction of signal conduction through the second amplifier die.

6. A Doherty amplifier comprising:
a module substrate having a top substrate surface;
an impedance inverter line coupled to the module substrate, wherein the impedance inverter line has a proximal end and a distal end, and the impedance inverter line is characterized by a first electrical length between the proximal and distal ends of the impedance inverter line;
a first surface-mount device coupled to the top substrate surface, wherein the first surface-mount device includes a first package body that is distinct from the module substrate, a first vertical lead, and a first amplifier die coupled to the first package body, wherein the first vertical lead has a proximal end internal to the first package body, and a distal end external to the first package body, wherein the proximal end of the first vertical lead is above a bottom surface of the first surface-mount device, wherein the first vertical lead is characterized by a second electrical length between the proximal and distal ends of the first vertical lead, wherein the proximal end of the first vertical lead is electrically coupled to an output terminal of a first power transistor integrally formed with the first amplifier die, and wherein the distal end of the first vertical lead is coupled to the proximal end of the impedance inverter line; and
a second surface-mount device coupled to the top substrate surface, wherein the second surface-mount device includes a second package body that is distinct from the first package body and from the module substrate, a second vertical lead, and a second amplifier die coupled to the second package body, wherein the second vertical lead has a proximal end internal to the second package body, and a distal end external to the second package body, wherein the proximal end of the second vertical lead is above a bottom surface of the second surface-mount device, wherein the second vertical lead is characterized by a third electrical length between the proximal and distal ends of the second vertical lead, wherein the proximal end of the second vertical lead is electrically coupled to an output terminal of a second power transistor integrally formed with the second amplifier die, and wherein the distal end of the second vertical lead is coupled to the distal end of the impedance inverter line.

7. The Doherty amplifier of claim 6, wherein each of the first and second surface-mount devices is a Quad Flat No-Lead (QFN) packaged device, and the distal ends of the first and second vertical leads are co-planar with the bottom surfaces of the first and second surface-mount devices.

8. The Doherty amplifier of claim 6, wherein the first and second vertical leads are gull wing leads.

9. The Doherty amplifier of claim 6, wherein each of the first and second package bodies include a Land Grid Array (LGA) that includes an array of lands at the bottom surfaces of the first and second surface-mount devices.

10. The Doherty amplifier of claim 6, wherein each of the first and second package bodies include a Ball Grid Array (BGA) that includes an array of balls at the bottom surfaces of the first and second surface-mount devices.

11. The Doherty amplifier of claim 6, wherein the first electrical length is in a range from 10 degrees to 80 degrees, the second electrical length is in a range from 2 degrees to 16 degrees, the third electrical length is in a range from 2 degrees to 16 degrees, and a total electrical length between the output terminals of the first and second power transistors includes the first, second, and third electrical lengths, and the total electrical length is 90 degrees at a fundamental frequency of operation of the Doherty amplifier.

12. The Doherty amplifier of claim 11, wherein the total electrical length is affected by parasitic output capacitances of the first and second power transistors.

13. The Doherty amplifier of claim 6, wherein:
the proximal end of the first vertical lead is electrically coupled to the output terminal of the first power transistor with at least one first wirebond, wherein the at least one first wirebond is characterized by a fourth electrical length; and
the proximal end of the second vertical lead is electrically coupled to the output terminal of the second power transistor with at least one second wirebond, wherein the at least one second wirebond is characterized by a fifth electrical length.

14. The Doherty amplifier of claim 13, wherein the first electrical length is in a range from 10 degrees to 80 degrees, the second electrical length is in a range from 2 degrees to 16 degrees, the third electrical length is in a range from 2 degrees to 16 degrees, the fourth electrical length is in a range from 3 degrees to 24 degrees, the fifth electrical length is in a range from 3 degrees to 24 degrees, and a total electrical length between the output terminals of the first and second power transistors includes the first, second, third, fourth, and fifth electrical lengths, and the total electrical length is 90 degrees at a fundamental frequency of operation of the Doherty amplifier.

15. The Doherty amplifier of claim 13, wherein each of the output terminals of the first and second amplifier dies have a side pad to which the at least one first wirebond or the at least one second wirebond are coupled, and the at least one first wirebond and the at least one second wirebond each extend in a direction that is orthogonal to a primary direction of signal conduction through the first or second amplifier die.

16. The Doherty amplifier of claim 6, wherein:
the first vertical lead is a first vertical conductor that conducts a first electrical signal between the proximal and distal ends of the first vertical lead in a direction that is angularly offset from a primary direction of signal conduction through the first amplifier die; and
the second vertical lead is a second vertical conductor that conducts a second electrical signal between the proximal and distal ends of the second vertical lead in a direction that is angularly offset from a primary direction of signal conduction through the second amplifier die.

17. The Doherty amplifier of claim 6, wherein the first and second surface-mount devices are orthogonally arranged, and the impedance inverter line has an L shape.

18. The Doherty amplifier of claim 6, wherein the first and second surface-mount devices are arranged in parallel, and the impedance inverter line is straight.

19. The Doherty amplifier of claim 6, wherein the first amplifier is a carrier amplifier, and the second amplifier is a peaking amplifier.

20. The Doherty amplifier of claim 6, wherein the first amplifier is a peaking amplifier, and the second amplifier is a carrier amplifier.

21. The Doherty amplifier of claim 1, wherein:
the first surface-mount device further includes a first flange, wherein the first package body holds the first flange and the first plurality of leads in a fixed orientation with respect to each other, and the first amplifier die is connected to the first flange; and
the second surface-mount device further includes a second flange, wherein the second package body holds the second flange and the second plurality of leads in a fixed orientation with respect to each other, and the second amplifier die is connected to the second flange.

22. The Doherty amplifier of claim 6, wherein:
the first surface-mount device further includes a first flange, wherein the first package body holds the first flange and the first vertical lead in a fixed orientation with respect to each other, and the first amplifier die is connected to the first flange; and
the second surface-mount device further includes a second flange, wherein the second package body holds the second flange and the second vertical lead in a fixed orientation with respect to each other, and the second amplifier die is connected to the second flange.

* * * * *